(12) United States Patent
Nakagawa

(10) Patent No.: US 10,342,130 B2
(45) Date of Patent: Jul. 2, 2019

(54) STRUCTURE MOUNTED WITH ELECTRONIC COMPONENT

(71) Applicant: Murata Manufacturing Co., Ltd., Nagaokakyo-shi, Kyoto-fu (JP)

(72) Inventor: Kiyoyuki Nakagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/600,134

(22) Filed: Jan. 20, 2015

(65) Prior Publication Data

US 2015/0223334 A1 Aug. 6, 2015

(30) Foreign Application Priority Data

Jan. 31, 2014 (JP) ................. 2014-017173

(51) Int. Cl.
*H05K 1/11* (2006.01)
*H01G 2/06* (2006.01)
(Continued)

(52) U.S. Cl.
CPC ............ *H05K 1/111* (2013.01); *H01G 2/065* (2013.01); *H01G 4/005* (2013.01); *H01G 4/008* (2013.01); *H01G 4/012* (2013.01); *H01G 4/12* (2013.01); *H01G 4/232* (2013.01); *H01G 4/30* (2013.01); *H05K 1/09* (2013.01); *H05K 1/181* (2013.01); *H05K 3/3442* (2013.01);
(Continued)

(58) Field of Classification Search
CPC .......... H01G 4/005; H01G 4/232; H01G 4/30; H01G 4/008; H01G 4/12; H01G 4/012; H01G 2/065; H05K 1/111; H05K 1/09; H05K 1/181; H05K 2201/10984
See application file for complete search history.

(56) References Cited

U.S. PATENT DOCUMENTS 3,612,963 A * 10/1971 Piper .................... H01G 4/2325
29/25.42
6,144,547 A † 11/2000 Retseptor
(Continued)

FOREIGN PATENT DOCUMENTS

| EP | 1519642 A1 * | 3/2005 | ............. H01G 2/065 |
| JP | 05-243074 A | 9/1993 | |

(Continued)

OTHER PUBLICATIONS

Official Communication issued in corresponding Japanese Patent Application No. 2014-017173, dated Jan. 12, 2016.

*Primary Examiner* — David M Sinclair
(74) *Attorney, Agent, or Firm* — Keating & Bennett, LLP

(57) ABSTRACT

A mounted structure includes an electronic component including external electrodes, a wiring substrate including lands, and joint portions composed of a solder joint material and configured to join the external electrodes and the lands. The external electrodes respectively include coatings that cover a principal surface of a body, which is opposed to the wiring substrate, and coatings that cover end surfaces of the body, which are opposed to each other in the length direction. A distance De between the coatings in the length direction and a distance Dl between the lands in the length direction satisfy a condition of $0.91 \leq Dl/De \leq 1.09$.

15 Claims, 19 Drawing Sheets

(51) Int. Cl.
*H01G 4/232* (2006.01)
*H01G 4/30* (2006.01)
*H01G 4/008* (2006.01)
*H01G 4/012* (2006.01)
*H01G 4/12* (2006.01)
*H05K 1/09* (2006.01)
*H05K 1/18* (2006.01)
*H01G 4/005* (2006.01)
*H05K 3/34* (2006.01)

(52) U.S. Cl.
CPC .............. *H05K 2201/10015* (2013.01); *H05K 2201/10636* (2013.01); *H05K 2201/10984* (2013.01); *H05K 2203/048* (2013.01); *H05K 2203/0465* (2013.01); *Y02P 70/611* (2015.11); *Y02P 70/613* (2015.11)

(56) References Cited

U.S. PATENT DOCUMENTS

| | | | | |
|---|---|---|---|---|
| 6,179,935 B1 * | 1/2001 | Yamashita | ........... | B23K 35/262 |
| | | | | 148/400 |
| 7,414,857 B2 † | 8/2008 | Ritter | | |
| 7,573,722 B2 * | 8/2009 | Tsai | ........... | H01R 43/0228 |
| | | | | 174/534 |
| 8,259,433 B2 * | 9/2012 | Nishisaka | ........... | H01G 4/232 |
| | | | | 361/306.3 |
| 8,363,382 B2 * | 1/2013 | Lien | ........... | H01G 4/30 |
| | | | | 252/514 |
| 8,958,213 B2 * | 2/2015 | Hoshi | ........... | H05K 1/181 |
| | | | | 361/767 |
| 9,288,906 B2 * | 3/2016 | Lee | ........... | H05K 1/111 |
| 2004/0066589 A1 * | 4/2004 | Togashi | ........... | H01G 2/065 |
| | | | | 361/15 |
| 2005/0178002 A1 * | 8/2005 | Maeno | ........... | H05K 1/111 |
| | | | | 29/840 |
| 2006/0126264 A1 * | 6/2006 | Yoshii | ........... | H01G 4/30 |
| | | | | 361/301.1 |
| 2008/0174931 A1 † | 7/2008 | Skamser et al. | | |
| 2008/0248687 A1 * | 10/2008 | Anthony | ........... | H01G 4/005 |
| | | | | 439/497 |
| 2010/0091429 A1 * | 4/2010 | Koga | ........... | H01G 4/012 |
| | | | | 361/321.2 |
| 2010/0118467 A1 * | 5/2010 | Takeuchi | ........... | H01G 4/232 |
| | | | | 361/306.3 |
| 2011/0114378 A1 * | 5/2011 | Yoshii | ........... | H01G 2/065 |
| | | | | 174/260 |
| 2012/0103678 A1 * | 5/2012 | Inaba | ........... | H05K 3/244 |
| | | | | 174/263 |
| 2012/0152604 A1 * | 6/2012 | Ahn | ........... | H01G 2/065 |
| | | | | 174/260 |
| 2014/0083755 A1 * | 3/2014 | Lee | ........... | H05K 1/181 |
| | | | | 174/260 |

FOREIGN PATENT DOCUMENTS

| | | | |
|---|---|---|---|
| JP | 11017308 A | * | 1/1999 |
| JP | 2004-281892 A | | 10/2004 |
| JP | 2006012976 A | * | 1/2006 |
| WO | 2006/048932 A1 | | 5/2006 |

\* cited by examiner
† cited by third party

FIG. 11

VERIFICATION EXAMPLE 1

| MANUFACTURING CONDITION | | | | | | | | | TEST RESULT | | | |
|---|---|---|---|---|---|---|---|---|---|---|---|---|
| LAMINATED CERAMIC CAPACITOR | | | | | WIRING SUBSTRATE | | | | MOUNTED STRUCTURE | | | |
| Lc [mm] | Wc (We1,We2) [mm] | Tc (Te1,Te2) [mm] | Le1,Le2 [mm] | De [mm] | Lb [mm] | Li1,Li2 [mm] | Wi1,Wi2 [mm] | Di [mm] | Lb/Lc [-] | Di/De [-] | PERCENT DEFECTIVE [%] | JOINT STRENGTH | EVALUATION |
| 0.25 | 0.125 | 0.125 | 0.07 | 0.11 | 0.25 | 0.08 | 0.125 | 0.09 | 1.00 | 0.82 | 2.1 | EXCELLENT | FAILURE |
| 0.25 | 0.125 | 0.125 | 0.07 | 0.11 | 0.25 | 0.075 | 0.125 | 0.1 | 1.00 | 0.91 | 0.8 | EXCELLENT | GOOD |
| 0.25 | 0.125 | 0.125 | 0.07 | 0.11 | 0.25 | 0.07 | 0.125 | 0.11 | 1.00 | 1.00 | 0.2 | EXCELLENT | EXCELLENT |
| 0.25 | 0.125 | 0.125 | 0.07 | 0.11 | 0.25 | 0.065 | 0.125 | 0.12 | 1.00 | 1.09 | 0.1 | GOOD | GOOD |
| 0.25 | 0.125 | 0.125 | 0.07 | 0.11 | 0.25 | 0.06 | 0.125 | 0.13 | 1.00 | 1.18 | 0.3 | FAILURE | FAILURE |
| 0.25 | 0.125 | 0.125 | 0.07 | 0.11 | 0.25 | 0.055 | 0.125 | 0.14 | 1.00 | 1.27 | 1.1 | FAILURE | FAILURE |
| 0.25 | 0.125 | 0.125 | 0.07 | 0.11 | 0.25 | 0.05 | 0.125 | 0.15 | 1.00 | 1.36 | 2.9 | FAILURE | FAILURE |

FIG. 13

| VERIFICATION EXAMPLE 2 ||||||||||||||
| MANUFACTURING CONDITION |||||||||| TEST RESULT ||||
| LAMINATED CERAMIC CAPACITOR |||| WIRING SUBSTRATE |||| MOUNTED STRUCTURE || | | |
| Lc [mm] | Wc (We1,We2) [mm] | Tc (Te1,Te2) [mm] | Le1,Le2 [mm] | De [mm] | Lb [mm] | Ll1,Ll2 [mm] | Wl1,Wl2 [mm] | Dl [mm] | Lb/Lc [-] | Dl/De [-] | PERCENT DEFECTIVE [%] | JOINT STRENGTH | EVALUATION |
|---|---|---|---|---|---|---|---|---|---|---|---|---|---|
| 0.25 | 0.125 | 0.125 | 0.07 | 0.11 | 0.21 | 0.055 | 0.125 | 0.1 | 0.84 | 0.91 | 1.9 | FAILURE | FAILURE |
| 0.25 | 0.125 | 0.125 | 0.07 | 0.11 | 0.25 | 0.075 | 0.125 | 0.1 | 1.00 | 0.91 | 0.8 | EXCELLENT | GOOD |
| 0.25 | 0.125 | 0.125 | 0.07 | 0.11 | 0.29 | 0.095 | 0.125 | 0.1 | 1.16 | 0.91 | 0.5 | EXCELLENT | EXCELLENT |
| 0.25 | 0.125 | 0.125 | 0.07 | 0.11 | 0.33 | 0.115 | 0.125 | 0.1 | 1.32 | 0.91 | 0.9 | EXCELLENT | GOOD |
| 0.25 | 0.125 | 0.125 | 0.07 | 0.11 | 0.37 | 0.135 | 0.125 | 0.1 | 1.48 | 0.91 | 2.4 | EXCELLENT | FAILURE |

FIG. 14

| | MANUFACTURING CONDITION | | | | | | | | | MOUNTED STRUCTURE | | TEST RESULT | | |
|---|---|---|---|---|---|---|---|---|---|---|---|---|---|---|
| | LAMINATED CERAMIC CAPACITOR | | | | WIRING SUBSTRATE | | | | | | | | | |
| Lc [mm] | Wc (We1,We2) [mm] | Tc (Te1,Te2) [mm] | Le1,Le2 [mm] | De [mm] | Lb [mm] | Li1,Li2 [mm] | Wi1,Wi2 [mm] | Di [mm] | Lb/Lc [-] | Di/De [-] | PERCENT DEFECTIVE [%] | JOINT STRENGTH | EVALUATION |
| 0.25 | 0.125 | 0.125 | 0.07 | 0.11 | 0.21 | 0.055 | 0.125 | 0.11 | 0.84 | 1.00 | 0.7 | FAILURE | FAILURE |
| 0.25 | 0.125 | 0.125 | 0.07 | 0.11 | 0.25 | 0.075 | 0.125 | 0.11 | 1.00 | 1.00 | 0.2 | EXCELLENT | EXCELLENT |
| 0.25 | 0.125 | 0.125 | 0.07 | 0.11 | 0.29 | 0.095 | 0.125 | 0.11 | 1.16 | 1.00 | 0.3 | EXCELLENT | EXCELLENT |
| 0.25 | 0.125 | 0.125 | 0.07 | 0.11 | 0.33 | 0.115 | 0.125 | 0.11 | 1.32 | 1.00 | 1.2 | EXCELLENT | PASS |
| 0.25 | 0.125 | 0.125 | 0.07 | 0.11 | 0.37 | 0.135 | 0.125 | 0.11 | 1.48 | 1.00 | 3.7 | EXCELLENT | FAILURE |

VERIFICATION EXAMPLE 3

FIG. 15

| VERIFICATION EXAMPLE 4 | | | | | | | | | | | | | |
|---|---|---|---|---|---|---|---|---|---|---|---|---|---|
| MANUFACTURING CONDITION | | | | | | | | | | | TEST RESULT | | |
| LAMINATED CERAMIC CAPACITOR | | | | WIRING SUBSTRATE | | | | MOUNTED STRUCTURE | | | | | |
| Lc [mm] | Wc (We1,We2) [mm] | Tc (Te1,Te2) [mm] | Le1,Le2 [mm] | De [mm] | Lb [mm] | Ll1,Ll2 [mm] | Wl1,Wl2 [mm] | Dl [mm] | Lb/Lc [-] | Dl/De [-] | PERCENT DEFECTIVE [%] | JOINT STRENGTH | EVALUATION |
| 0.25 | 0.125 | 0.125 | 0.07 | 0.11 | 0.21 | 0.055 | 0.125 | 0.12 | 0.84 | 1.09 | 0.2 | FAILURE | FAILURE |
| 0.25 | 0.125 | 0.125 | 0.07 | 0.11 | 0.25 | 0.075 | 0.125 | 0.12 | 1.00 | 1.09 | 0.1 | GOOD | EXCELLENT |
| 0.25 | 0.125 | 0.125 | 0.07 | 0.11 | 0.29 | 0.095 | 0.125 | 0.12 | 1.16 | 1.09 | 0.6 | GOOD | GOOD |
| 0.25 | 0.125 | 0.125 | 0.07 | 0.11 | 0.33 | 0.115 | 0.125 | 0.12 | 1.32 | 1.09 | 2.0 | GOOD | PASS |
| 0.25 | 0.125 | 0.125 | 0.07 | 0.11 | 0.37 | 0.135 | 0.125 | 0.12 | 1.48 | 1.09 | 6.8 | GOOD | FAILURE |

STRUCTURE MOUNTED WITH ELECTRONIC COMPONENT

BACKGROUND OF THE INVENTION

1. Field of the Invention

The present invention relates to a structure mounted with an electronic component (hereinafter, also referred to simply as a mounted structure), which preferably has a rectangular or substantially rectangular parallelepiped shaped electronic component mounted on a wiring substrate via a solder joint material.

2. Description of the Related Art

In recent years, with requested downsizing of electronic devices, electronic components typified by resistive elements, capacitor elements, and the like as passive components have been progressively reduced in size. For example, laminated ceramic capacitors as a type of capacitor element has been exponentially reduced in size, and laminated ceramic capacitors with outside dimensions in the height direction, width direction, and depth direction all below 1.0 mm have been used widely.

In general, electronic components which have a pair of external electrodes provided on the surface of a body as a component main body, are mounted onto wiring substrates by joining with the use of a solder joint material so that the pair of external electrodes corresponds to a pair of lands provided for the wiring substrates.

Typically, the pair of external electrodes described above is often provided not only on the bottom surface of the body, which is opposed to the wiring substrate, but also even over a pair of end surfaces of the body, which is opposite in a predetermined direction, and moreover, often provided over not only the bottom surface and the pair of end surfaces, but also a pair of side surfaces and a ceiling surface, which are adjacent to the end surfaces (that is, so as to cover a pair of ends of the body located in the predetermined direction).

This configuration will, in the case of joining with the use of a solder joint material, cause the solder joint material to bank with wettability along the surfaces of the external electrodes provided to cover the end surfaces of the body, or the pair of side surfaces in addition to the end surfaces, a great self-alignment effect will be thus produced to mount the electronic component in a more appropriate position, and the joint strength between the electronic component and the wiring substrate will be kept high.

However, in the case of the electronic component configured as described above, it is known that a phenomenon of the electronic component mounted in a standing posture different from the intended posture on the wiring substrate is caused by the separation of one of the pair of external electrode from the wiring substrate in mounting the component. The phenomenon is typically referred to as a tombstone phenomenon or a Manhattan phenomenon, which is one type of defective mounting.

The phenomenon is caused by the generation of an imbalance between external forces applied to the electronic component due to the surface tension of the melted solder joint material banked with wettability on each end surface of the pair of external electrodes, and caused by various factors such as misalignment of the electronic component with respect to the wiring substrate during mounting, the shifted location of the solder joint material supplied, the excessive supply of the solder joint material, and asymmetric outlines of the pair of external electrodes.

Conventionally, from the perspective of preventing the phenomenon from being caused, measures such as increased positioning accuracy between respective components during mounting and the appropriately managed supply of the solder joint material are taken while making an attempt to increase the outline dimension accuracy for each component.

On the other hand, as another approach for preventing the phenomenon from being caused, JP 5-243074 A proposes that a metallic layer on which a solder joint material is unlikely to spread with wettability is formed so as to cover each end surface of a pair of external electrode.

However, the phenomenon has a tendency to be caused at increased frequency as the electronic component to be mounted is reduced in size, and has become obvious as an especially large problem in extremely compact electronic components with outside dimensions of 0.5 mm or less in the height direction, the width direction, and the depth direction.

More precisely, even when the supply of the solder joint material is appropriately managed while an attempt is made to increase the outside dimension accuracy for each component, it is extremely difficult in the first place to handle extremely compact electronic components with a high degree of accuracy, there is thus a natural limit to the increased positioning accuracy between the respective components during mounting, and the frequency of the phenomenon is not able to be sufficiently reduced just by this measure.

Moreover, when the approach disclosed in JP 5-243074 A as mentioned above is adopted, firstly, a problem occurs which is that the self-alignment effect described above is significantly damaged to make misalignment likely to be caused in relation to the mounting position of the electronic component, and secondly, in the case of extremely small electronic components as described above, it is difficult in the first place to form a metallic layer on which the solder joint material is unlikely to spread with wettability, so as to cover each end surface of the pair of external electrodes.

SUMMARY OF THE INVENTION

Therefore, preferred embodiments of the present invention provide a mounted structure with a high degree of mounting position accuracy and sufficient joint strength ensured while significantly reducing or preventing generation of defective mounting of an electronic component brought into a standing posture during mounting.

A structure mounted with an electronic component in accordance with a preferred embodiment of the present invention has a rectangular or substantially rectangular parallelepiped shaped electronic component mounted on a wiring substrate with the use of a solder joint material. The electronic component includes a body including a first principal surface and a second principal surface opposite to each other in a thickness direction, a first end surface and a second end surface opposite to each other in a length direction perpendicular or substantially perpendicular to the thickness direction, and a first side surface and a second side surface opposite to each other in a width direction perpendicular or substantially perpendicular to both the thickness direction and the length direction; and a first external electrode and a second external electrode spaced from each other in the length direction.

The first external electrode includes at least a first coating portion that covers a portion of the second principal surface located closer to the first end surface, and a second coating portion that covers the first end surface, whereas the second external electrode includes at least a third coating portion that covers a portion of the second principal surface located closer to the second end surface, and a fourth coating portion that covers the second end surface. The wiring substrate includes a base with a principal surface, and a first land and a second land disposed on the principal surface to be spaced from each other. The electronic component has the first coating portion opposed to the first land and the third coating portion opposed to the second land, and the solder joint material includes a first joint portion that joins the first external electrode and the first land, and a second joint portion that joins the second external electrode and the second land. The first joint portion adheres to the first land, and adheres to the first external electrode so as to bridge between the first coating portion and the second coating portion, whereas the second joint portion adheres to the second land, and adheres to the second external electrode so as to bridge between the third coating portion and the fourth coating portion. In the structure mounted with an electronic component in accordance with a preferred embodiment of the present invention, when a maximum outside dimension of the electronic component is denoted by Lc in the length direction, the Lc fulfills a condition of Lc≤0.5 mm, and when a distance between the first coating portion and the second coating portion is denoted by De in the length direction, whereas a distance between the first land and the second land is denoted by Dl in the length direction, De and Dl fulfill a condition of 0.91≤Dl/De≤1.09.

In the structure mounted with an electronic component in accordance with a preferred embodiment of the present invention, De and Dl preferably further fulfill a condition of Dl/De≤1.00.

In the structure mounted with an electronic component in accordance with a preferred embodiment of the present invention, when the dimension from an end of the first land on the side opposite to the side on which the second land is located to an end of the second land on the side opposite to the side on which the first land is located is denoted by Lb in the length direction, Lc and Lb preferably further fulfill a condition of 1.00≤Lb/Lc≤1.32.

In the structure mounted with an electronic component in accordance with a preferred embodiment of the present invention, a surface layer of the first external electrode and a surface layer of the second external electrode preferably include Sn as a constituent, and in that case, the solder joint material preferably includes Sn, Ag, and Cu as constituents.

In the structure mounted with an electronic component in accordance with a preferred embodiment of the present invention, a surface layer of the first external electrode and a surface layer of the second external electrode preferably include Sn as a constituent, and in that case, the solder joint material preferably includes Sn and Sb as constituents.

In the structure mounted with an electronic component in accordance with a preferred embodiment of the present invention, the first external electrode preferably further includes a fifth coating portion that covers a portion of the first side surface located closer to the first end surface, a sixth coating portion that covers a portion of the second side surface located closer to the first end surface, and a seventh coating portion that covers a portion of the first principal surface located closer to the first end surface, whereas the second external electrode preferably further includes an eighth coating portion that covers a portion of the first side surface located closer to the second end surface, a ninth coating portion that covers a portion of the second side surface located closer to the second end surface, and a tenth coating portion that covers a portion of the first principal surface located closer to the second end surface, and in that case, the first joint portion preferably adheres to the first land, and adheres to the first external electrode so as to cover the first coating portion, the second coating portion, the third coating portion, the fourth coating portion, and the fifth coating portion, whereas the second joint portion preferably adheres to the second land, and adheres to the second external electrode so as to cover the sixth coating portion, the seventh coating portion, the eighth coating portion, the ninth coating portion, and the tenth coating portion.

In the structure mounted with an electronic component in accordance with a preferred embodiment of the present invention, the electronic component preferably is a laminated ceramic capacitor, for example.

According to various preferred embodiments of the present invention, a mounted structure achieves a high degree of mounting position accuracy and sufficient joint strength while significantly reducing or preventing generation of defective mounting of an electronic component brought into a standing posture during mounting.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 11 is a table showing manufacturing conditions and test results of Verification Example 1 in a first verification test.

FIG. 13 is a table showing manufacturing conditions and test results of Validation Example 2 in a second verification test.

FIG. 14 is a table showing manufacturing conditions and test results of Validation Example 3 in the second verification test.

FIG. 15 is a table showing manufacturing conditions and test results of Validation Example 4 in a second verification test.

DETAILED DESCRIPTION OF THE PREFERRED EMBODIMENTS

Figure 1:
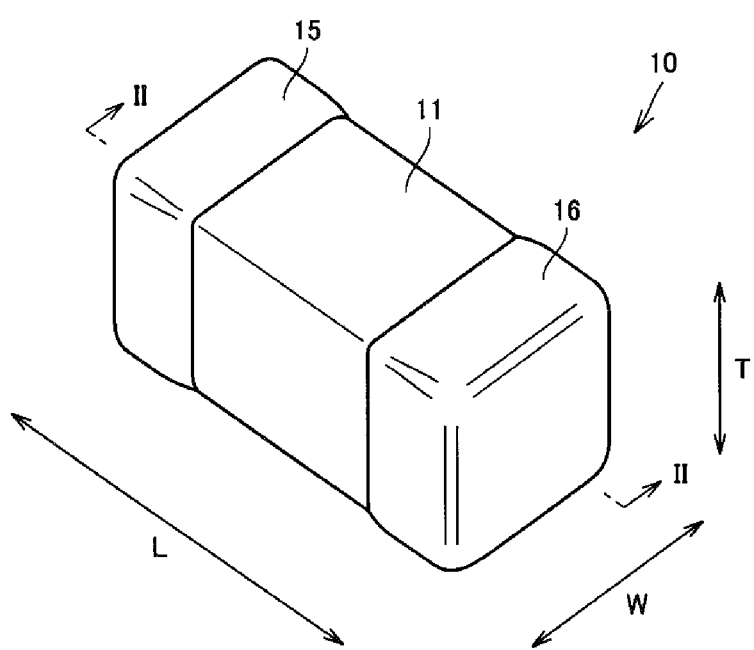
FIG. 1 is a perspective view of a laminated ceramic capacitor provided for a mounted structure in accordance with Preferred Embodiment 1 of the present invention.

Preferred embodiments of the present invention will be described in detail below with reference to the drawings. It is to be noted that the same or common elements in the following preferred embodiments are denoted by the same reference numerals in the figures, and descriptions of the elements will not be repeated.

In the following preferred embodiments, a circuit board with a laminated ceramic capacitor mounted on a wiring circuit will be exemplified and described as the structure mounted with an electronic component. In addition, the electronic component mounted on the wiring substrate by applying various preferred embodiments of the present invention may be any component such as other types of capacitor elements and resistive elements.

Preferred Embodiment 1

Figure 2:
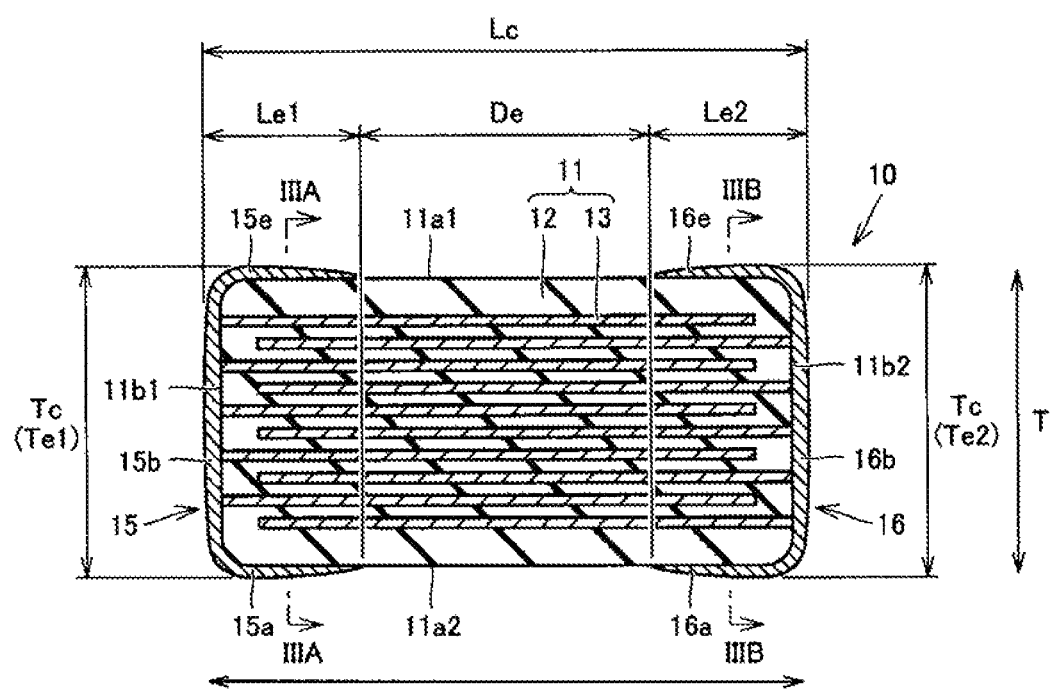
FIG. 2 is a schematic cross-sectional view along the line II-II shown in FIG. 1.
Figure 3A:
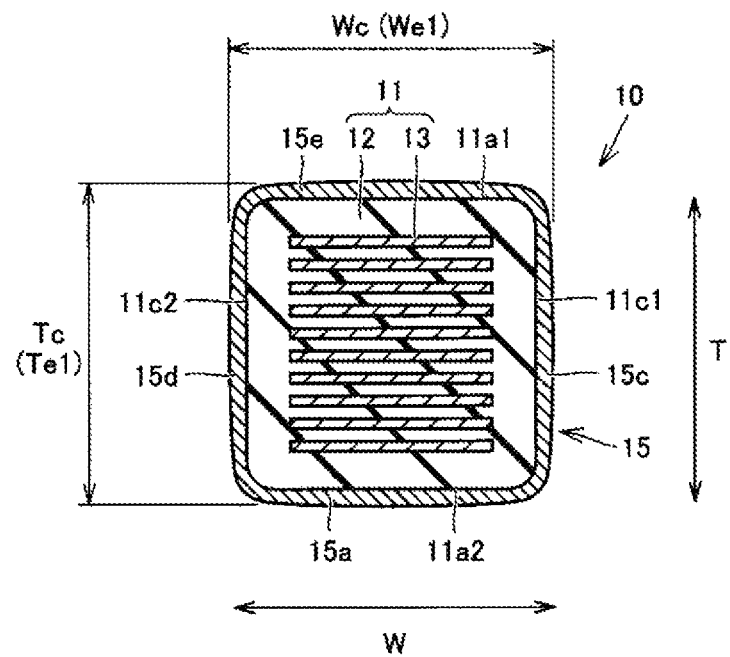
FIGS. 3A and 3B are schematic cross-sectional views along the line IIIA-IIIA and line IIIB-IIIB shown in FIG. 2.
Figure 3B:
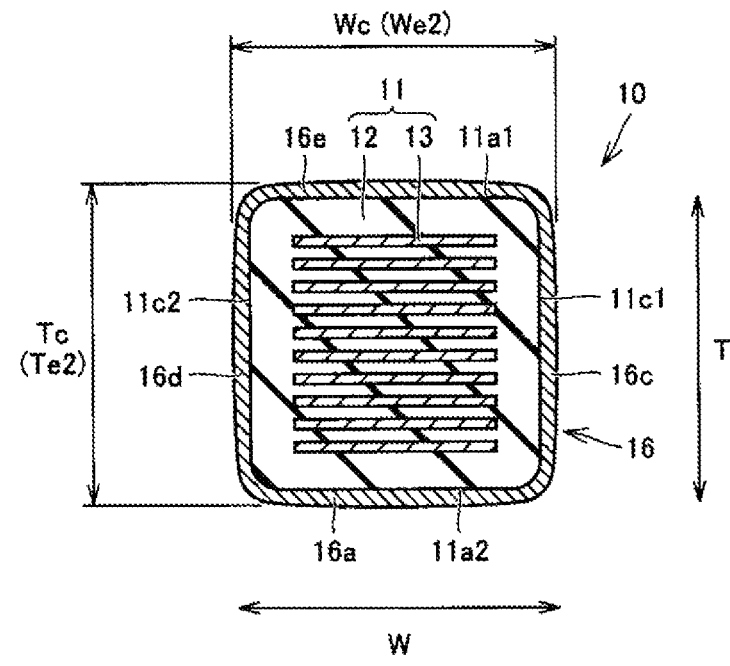

FIG. 1 is a perspective view of a laminated ceramic capacitor provided for a mounted structure in accordance with Preferred Embodiment 1 of the present invention. In addition, FIG. 2 is a schematic cross-sectional view along the line II-II shown in FIG. 1, and FIGS. 3A and 3B are schematic cross-sectional views along the line IIIA-IIIA and line IIIB-IIIB shown in FIG. 2. First, a laminated ceramic capacitor 10 provided for the mounted structure in accordance with the present preferred embodiment will be described with reference to FIGS. 1 to 3.

As shown in FIGS. 1 to 3, the laminated ceramic capacitor 10 is an electronic component which preferably has a generally rectangular or substantially rectangular parallelepiped shape, and includes a body 11, and a first external electrode 15 and a second external electrode 16 as a pair of external electrodes. It is to be noted that the rectangular or substantially rectangular parallelepiped shape also encompasses shapes with corners and ridges rounded.

As shown in FIGS. 2 and 3, the body 11, which preferably has a rectangular or substantially rectangular parallelepiped shape, includes dielectric layers 12 and internal electrode layers 13 alternately stacked in a predetermined direction. The dielectric layers 12 are preferably made of a ceramic material containing, for example, barium titanate as its main constituent.

Furthermore, the dielectric layers 12 may contain a Mn compound, a Mg compound, a Si compound, a Co compound, a Ni compound, a rare-earth compound, etc. as accessory constituents for a ceramic powder to define a raw material for ceramic sheets as described later. On the other hand, the internal electrode layers 13 are preferably made of a metallic material typified by, for example, Ni, Cu, Ag, Pd, a Ag—Pd alloy, and Au.

The body 11 is made in such a way that a plurality of material sheets with a conductive paste to define the internal electrode layers 13 printed on surfaces of ceramic sheets (so-called green sheets) to define the dielectric layers 12 is prepared, stacked, and subjected to pressure bonding and firing.

It is to be noted that the material of the dielectric layers 12 is not limited to the above-mentioned ceramic material containing barium titanate as its main constituent, but other high-dielectric-constant ceramic materials (containing, as their main constituent, $CaTiO_3$, $SrTiO_3$, or $CaZrO_3$, for example) may be selected as the material of the dielectric layers 12. In addition, the material of the internal electrode layers 13 is also not limited to the metallic material mentioned above, but other conductive materials may be selected as the material of the internal electrode layers 13.

As shown in FIGS. 1 and 2, the first external electrode 15 and the second external electrode 16 are spaced from each other to cover the outer surfaces at both ends in a predetermined direction of the body 11. The first external electrode 15 and the second external electrode 16 each include a conductive film.

The first external electrode 15 and the second external electrode 16 preferably include, for example, a laminated film of a sintered metallic layer and a plated layer. The sintered metallic layer is preferably formed by, for example, baking a paste such as Cu, Ni, Ag, Pd, an Ag—Pd alloy, and Au. The plated layer preferably includes, for example, a Ni plated layer and a Sn plated layer that covers the Ni plated layer. The plated layer may be instead a Cu plated layer or an Au plated layer, for example. In addition, the first external electrode 15 and the second external electrode 16 may include only the plated layer. Furthermore, it is also possible to use a conductive resin paste as the first external electrode 15 and the second external electrode 16.

In this case, surface layers of the first external electrode 15 and second external electrode 16 preferably contain Sn as a constituent. As such a composition, a composition with a Sn plated layer for the outermost layer mentioned above can be used in a preferred manner.

As shown in FIG. 2, one of the pair of internal electrode layers 13 adjacent to each other with the dielectric layer 12 sandwiched therebetween in the stacking direction is electrically connected to the first external electrode 15 within the laminated ceramic capacitor 10, whereas the other of the pair of internal electrode layers 13 adjacent to each other with the dielectric layer 12 sandwiched therebetween in the stacking direction is electrically connected to the second external electrode 16 within the laminated ceramic capacitor 10. Thus, a plurality of capacitor elements is electrically connected in parallel between the first external electrode 15 and second external electrode 16 as a pair of external electrodes.

As shown in FIGS. 1 to 3 herein, the stacking direction of in the dielectric layers 12 and internal electrode layers 13 of the body 11 is defined as a thickness direction T, the spacing direction of the first external electrode 15 and second external electrode 16 is defined as a length direction L of the laminated ceramic capacitor 10, and the direction perpendicular or substantially perpendicular to both the length direction L and the thickness direction is defined as a width direction W, and these terms are used in the subsequent description. It is to be noted that also in the case of specifying the orientation of a wiring substrate 20A as described later, these terms are used to describe the orientation of the wiring substrate 20A in line with the mounting orientation of the laminated ceramic capacitor 10.

In addition, of six surfaces of the body 11, the pair of surfaces opposite to each other in the thickness direction T is defined as a first principal surface 11a1 and a second principal surface 11a2, the pair of surfaces opposite to each other in the length direction L is defined as a first end surface 11b1 and a second end surface 11b2, and the pair of surfaces opposite to each other in the width direction W is defined as a first side surface 11c1 and a second side surface 11c2, and these terms are used in the subsequent description.

As shown in FIGS. 1 to 3, the first external electrode and second external electrode 16 spaced from each other to cover the surface of the body 11 are each provided to cover ends in the length direction L of the body 11.

Specifically, referring to FIG. 2 and FIGS. 3A and 3B, the first external electrode 15 includes a first coating portion 15a that covers a portion of the second principal surface 11a2 located closer to the first end surface 11b1, a second coating portion 15b that covers the first end surface 11b1, a fifth coating portion 15c that covers a portion of the first side surface 11c1 located closer to the first end surface 11b1, a sixth coating portion 15d that covers a portion of the second side surface 11c2 located closer to the first end surface 11b1, and a seventh coating portion 15e that covers a portion of the first principal surface 11a1 located closer to the first end surface 11b1.

On the other hand, the second external electrode 16 includes a third coating portion 16a that covers a portion of the second principal surface 11a2 located closer to the second end surface 11b2, a fourth coating portion 16b that covers the second end surface 11b2, an eighth coating portion 16c that covers a portion of the first side surface 11c1 located closer to the second end surface 11b2, a ninth coating portion 16d that covers a portion of the second side surface 11c2 located closer to the second end surface 11b2, and a tenth coating portion 16e that covers a portion of the first principal surface 11a1 located closer to the second end surface 11b2.

Thus, the maximum outside dimension Tc of the laminated ceramic capacitor 10 in the thickness direction T is defined by the maximum value Te1 of the distance in the thickness direction T between an exposed surface of the first coating portion 15a of the first external electrode 15 and an exposed surface of the seventh coating portion 15e of the first external electrode 15, or the maximum value Te2 of the distance in the thickness direction T between an exposed surface of the third coating portion 16a of the second external electrode 16 and an exposed surface of the tenth coating portion 16e of the second external electrode 16. It is to be noted that typically, the capacitor preferably is configured so that the maximum values Te1 and Te2 have the same dimension or substantially the same dimension (e.g., within manufacturing tolerances).

Furthermore, the maximum outside dimension Lc in the length direction L of the laminated ceramic capacitor 10 is defined by the maximum value of the distance in the length direction L between an exposed surface of the second coating portion 15b of the first external electrode 15 and an exposed surface of the fourth coating portion 16b of the second external electrode 16. It is to be noted that the maximum outside dimension Lc is preferably configured to fulfill a predetermined condition with a dimension Lb (see FIG. 5, etc.) in the length direction L from an end of a first land 25 of the wiring substrate 20A described later on the side opposite to the position of a second land 26 to an end of the second land 26 thereof on the side opposite to the position of the first land 25, but details of the condition will be described later.

Moreover, the maximum outside dimension Wc of the laminated ceramic capacitor 10 in the width direction W is defined by the maximum value We1 of the distance in the width direction W between an exposed surface of the fifth coating portion 15c of the first external electrode 15 and an exposed surface of the sixth coating portion 15d of the first external electrode 15, or the maximum value We2 of the distance in the width direction W between an exposed surface of the eighth coating portion 16c of the second external electrode 16 and an exposed surface of the ninth coating portion 16d of the second external electrode 16. It is to be noted that typically, the capacitor is configured so that the maximum values We1 and We2 have the same dimension. In addition, the maximum outside dimension Wc is preferably configured to fulfill a predetermined condition with outside dimensions Wl1 and Wl2 of the first land 25 and second land 26 of the wiring substrate 20A described later in the width direction W, but details of the condition will be described later.

In this case, the outside dimension Le1 of the first coating portion 15a of the first external electrode 15 in the length direction L and the outside dimension Le2 of the third coating portion 16a of the second external electrode 16 in the length direction L are preferably configured so as to be equal or substantially equal, and the distance De in the length direction L between the first coating portion 15a of the first external electrode 15 and the third coating portion 16a of the second external electrode 16 is sufficient to ensure insulation performance therebetween. In addition, the distance De is configured to fulfill a predetermined condition with the distance Dl (see FIG. 5, etc.) in the length direction L between the first land 25 and second land 26 of the wiring substrate 20A described later, but details of the condition will be described later.

It is to be noted that the laminated ceramic capacitor according to the present preferred embodiment is configured so that the maximum outside dimension Lc in the length direction L is the longest dimension, and configured so that the maximum outside dimension Tc in the thickness direction T and the maximum outside dimension Wc in the width direction W are equal dimensions with a magnitude of approximately half the maximum outside dimension Lc in the length direction L.

Representative non-limiting values of the maximum outside dimensions Lc, Wc, and Tc of the laminated ceramic capacitor 10 herein include, for example, approximately 0.4 mm×0.2 mm×0.2 mm and approximately 0.25 mm×0.125 mm×0.125 mm.

Figure 4:
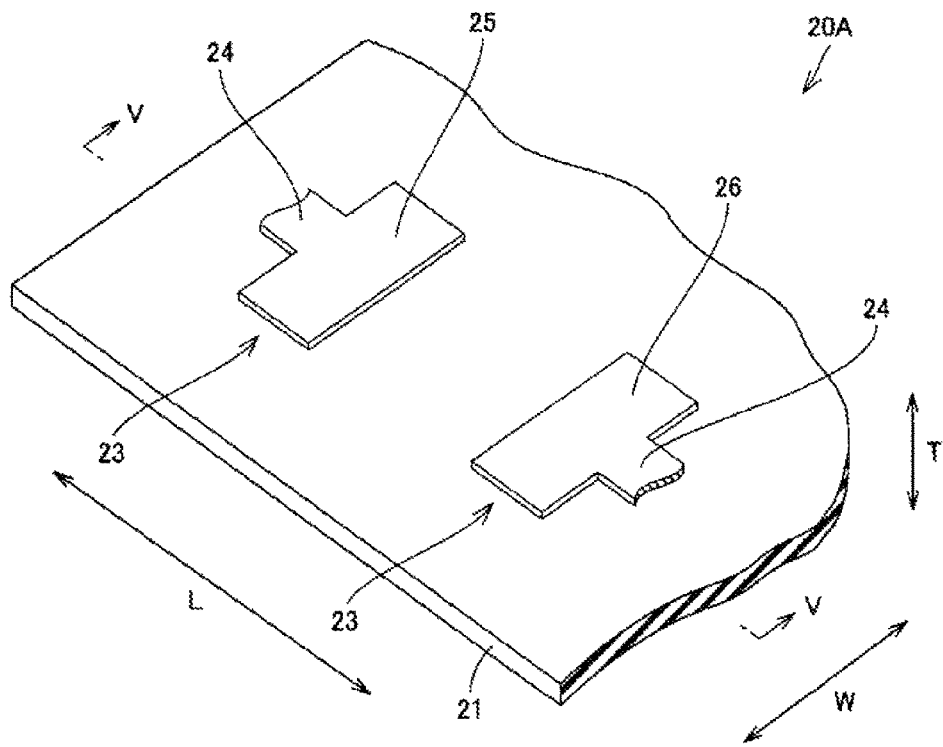
FIG. 4 is a schematic perspective view of a wiring substrate provided for the mounted structure according to Preferred Embodiment 1 of the present invention.

FIG. 4 is a schematic perspective view of a wiring substrate provided for the mounted structure according to the present preferred embodiment.

Figure 5:
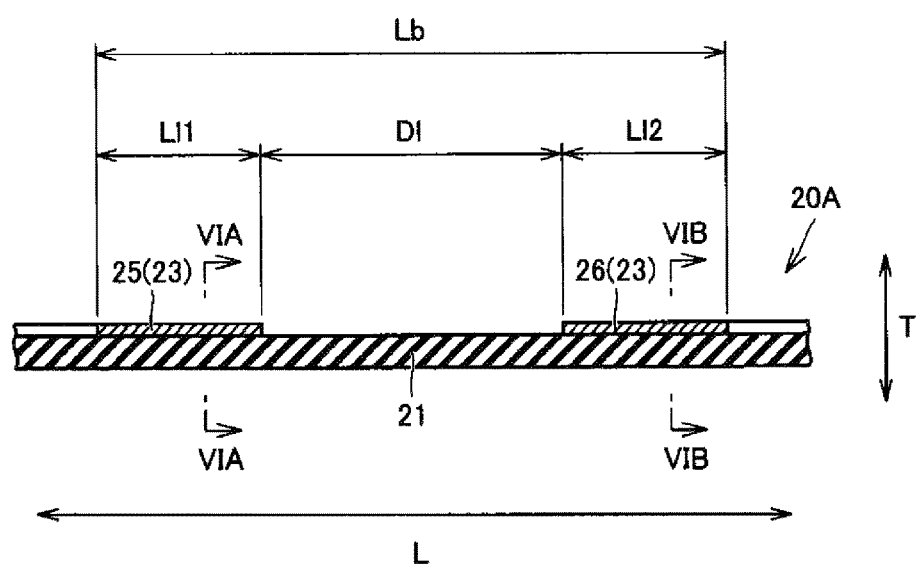
FIG. 5 is a schematic cross-sectional view along the line V-V shown in FIG. 4.
Figure 6A:
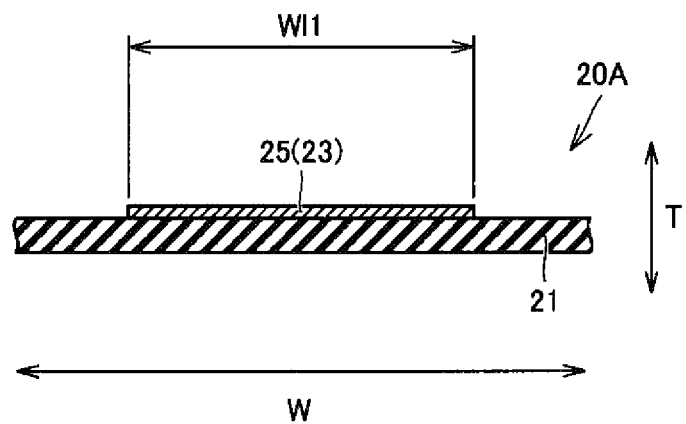
FIGS. 6A and 6B are schematic cross-sectional views along the line VIA-VIA and line VIB-VIB shown in FIG. 5.
Figure 6B:
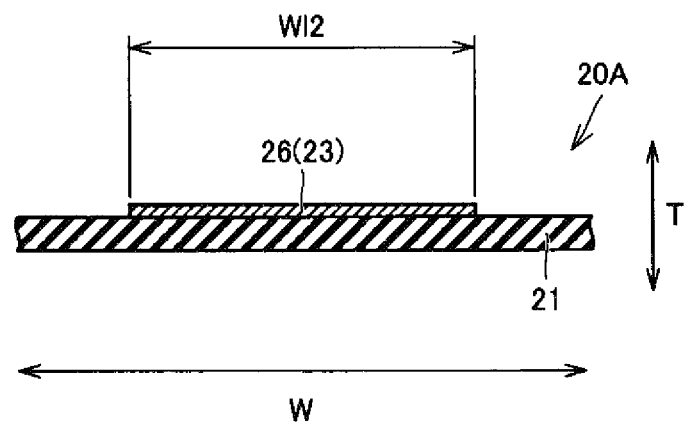

In addition, FIG. 5 is a schematic cross-sectional view along the line V-V shown in FIG. 4, and FIGS. 6A and 6B are schematic cross-sectional views along the line VIA-VIA and line VIB-VIB shown in FIG. 5. Next, the wiring substrate 20A provided for the mounted structure according to the present preferred embodiment will be described with reference to FIG. 4 to FIGS. 6A and 6B.

As shown in FIG. 4 to FIGS. 6A and 6B, the wiring substrate 20A, which has a generally plate-shaped, is provided with a base 21 and conductive patterns 23.

The base 21 preferably is plate-shaped and includes a pair of principal surfaces, and the conductive patterns 23 are provided on at least one of the principal surfaces. As the material of the base 21, materials can be used such as resin materials such as epoxy resins and ceramic materials such as alumina, or the materials with fillers, woven fabrics, etc. of inorganic materials or organic materials added thereto. In general, a glass epoxy substrate of an epoxy resin matrix with a glass woven fabric added thereto preferably is used in a preferred manner as the base 21.

The conductive patterns 23 are provided on the principal surface of the base 21, and patterned in predetermined shapes. The conductive patterns 23 include portions that define the first land 25 and the second land 26, and wiring portions 24 extracted from the first land 25 and the second land 26. While various types of conductive materials can be used as the materials of the conductive patterns 23, metallic materials such as copper foil are typically used in a preferred manner.

The portions that define the first land 25 and the second land 26 of the conductive patterns 23 preferably have shapes corresponding to the first external electrode 15 and second external electrode 16 of the laminated ceramic capacitor 10, and spaced in the length direction L of the wiring substrate 20A on which the laminated ceramic capacitor 10 is to be mounted.

In this case, the outside dimension Ll1 of the first land 25 in the length direction L and the outside dimension Ll2 of the second land 26 in the length direction L are preferably configured so as to be equal or substantially equal to each other, and the distance Dl in the length direction L between the first land 25 and the second land 26 is sufficient to ensure insulation performance therebetween. In addition, the distance Dl in the length direction L between the first land 25 and the second land 26 preferably is configured to fulfill a condition of $0.91 \leq Dl/De \leq 1.09$ with the distance De in the length direction L between the first coating portion 15a and third coating portion 16a of the laminated ceramic capacitor 10.

Furthermore, the dimension Lb in the length direction L from an end of the first land 25 on the side opposite to the position of the second land 26 to an end of the second land 26 on the side opposite to the position of the first land 25 is preferably configured to fulfill a condition of $1.00 \leq Lb/Lc \leq 1.32$ with the maximum outside dimension Lc of the laminated ceramic capacitor 10 in the length direction L, for example.

Furthermore, the outside dimension W1 of the first land 25 in the width direction W and the outside dimension W2 of the second land 26 in the width direction W are preferably configured so as to be equal to each other or substantially equal to each other, and preferably configured respectively to fulfill conditions of: $1.00 \leq Wl1/We1 \leq 1.30$ and $1.00 \leq Wl2/We2 \leq 1.30$ with the maximum value We1 of the first coating portion 15a of the laminated ceramic capacitor 10 in the width direction W and the maximum value We2 of the third coating portion 16a thereof in the width direction W, for example.

Figure 7:
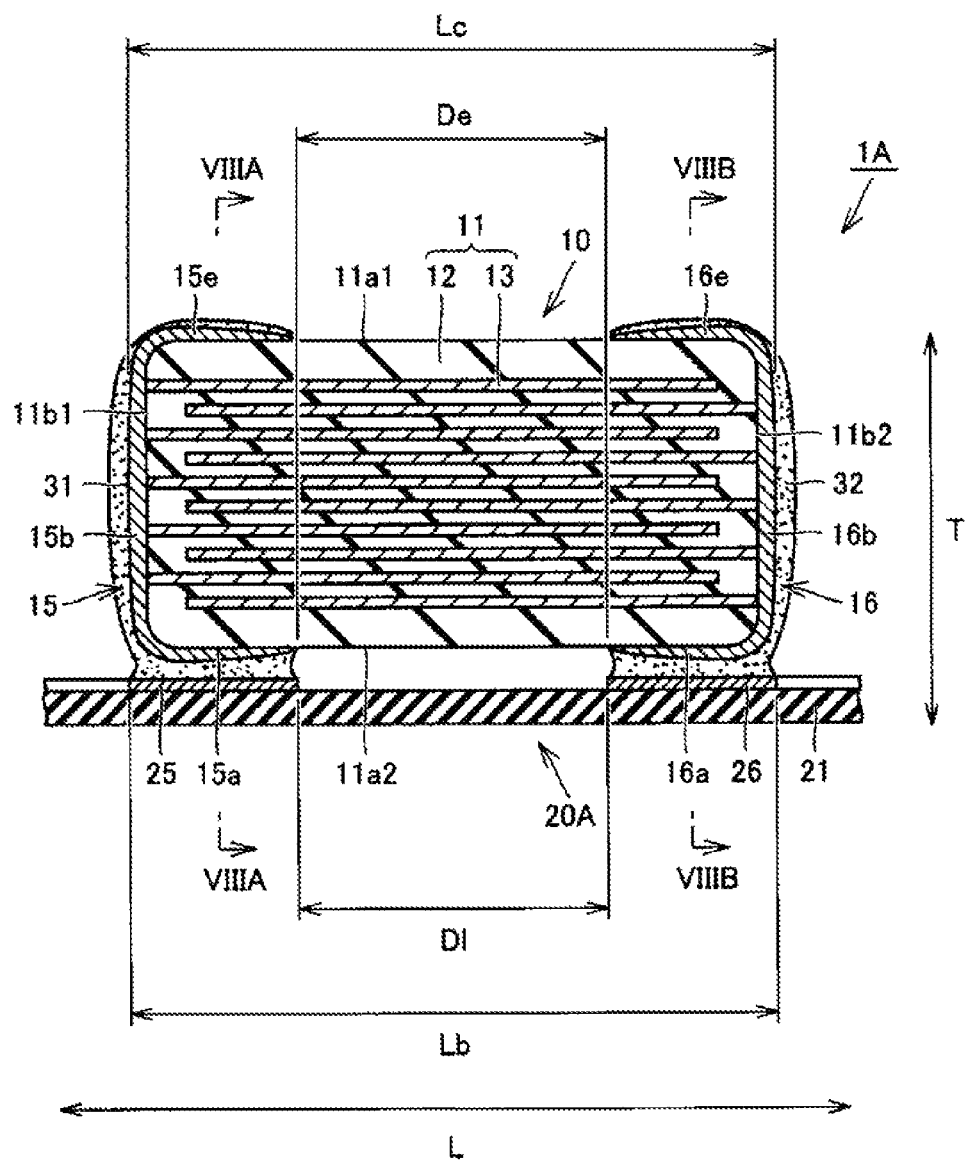
FIG. 7 is a schematic cross-sectional view of the mounted structure according to Preferred Embodiment 1 of the present invention.
Figure 8A:
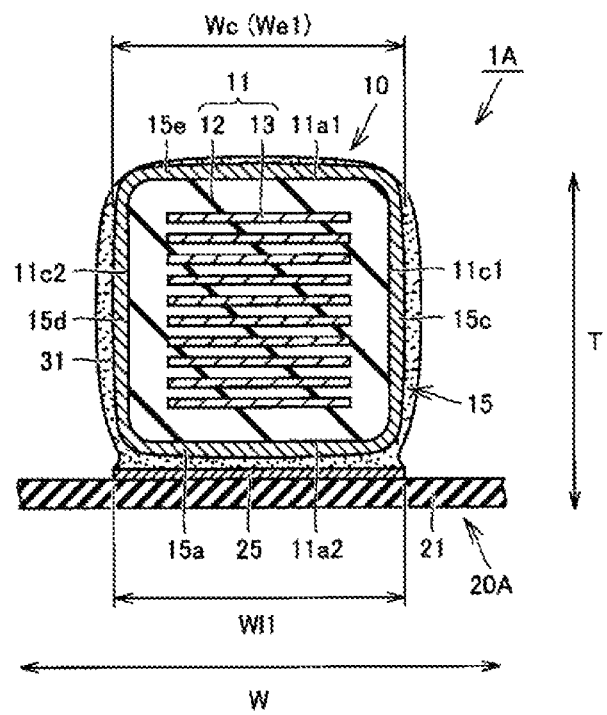
FIGS. 8A and 8B are schematic cross-sectional views along the line VIIIA-VIIIA and line VIIIB-VIIIB shown in FIG. 7.
Figure 8B:
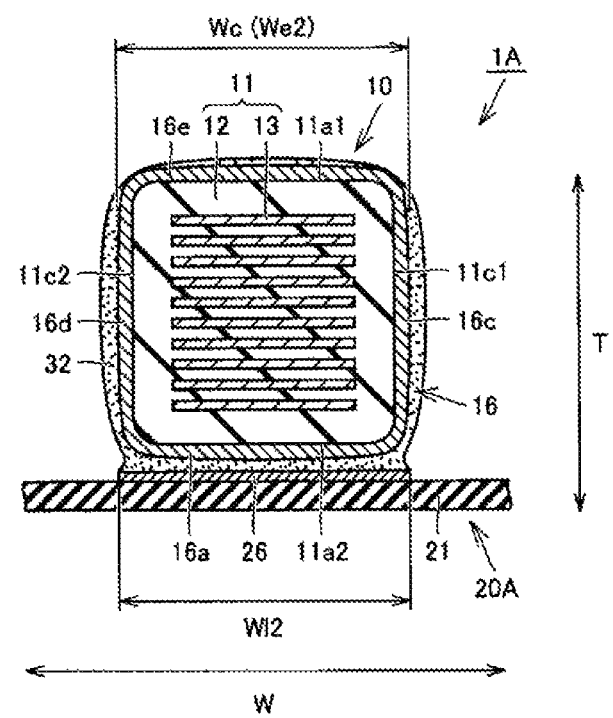

FIG. 7 is a schematic cross-sectional view of the mounted structure according to the present preferred embodiment, and FIGS. 8A and 8B are schematic cross-sectional views along the line VIIIA-VIIIA and line VIIIB-VIIIB shown in FIG. 7. Next, the mounted structure 1A according to the present preferred embodiment will be described with reference to FIG. 7 and FIGS. 8A and 8B.

As shown in FIG. 7 and FIGS. 8A and 8B, the mounted structure 1A has the above-configured laminated ceramic capacitor 10 mounted on the above-configured wiring substrate 20A, and includes a first joint portion 31 and a second joint portion 32 which are composed of a solder joint material, in addition to the laminated ceramic capacitor 10 and the wiring substrate 20A.

The laminated ceramic capacitor 10 is arranged with the second principal surface 11a2 of the body 11 opposed to the wiring substrate 20A, so that the first coating portion 15a of the first external electrode 15 is opposed to the first land 25 of the wiring substrate 20A, and the third coating portion 16a of the second external electrode 16 is opposed to the second land 26 of the wiring substrate 20A.

The first joint portion 31 joins the first external electrode 15 and first land 25 opposing each other, adheres to the surface of the first land 25, and adheres to the surface of the first external electrode 15 so as to cover the first coating portion 15a, second coating portion 15b, fifth coating portion 15c, sixth coating portion 15d, and seventh coating portion 15e of the first external electrode 15.

On the other hand, the second joint portion 32 joins the second external electrode 16 and second land 26 opposing each other, adheres to the surface of the second land 26, and adheres to the surface of the second external electrode 16 so as to cover the third coating portion 16a, fourth coating portion 16b, eighth coating portion 16c, ninth coating portion 16d, and tenth coating portion 16e of the second external electrode 16.

The first joint portion 31 and the second joint portion 32 are preferably composed of a solder joint material as described above, and formed by, for example, melting and solidifying a solder paste that is a mixture of a solder alloy and a flux as an organic material. The solder joint material preferably contains, as its main constituent, a solder alloy containing Sn. As the solder joint material, it is preferable to use, for example, ternary materials (melting temperature: about 217° C. to about 228° C.) with an Ag content of more than 0 wt % and about 3.5 wt % or less and a Cu content of about 0.5 wt % or more and about 0.7 wt % or less among the metallic constituents contained in the solder joint material, or materials as folders for high temperatures (melting temperature: about 240° C. to about 260° C.) with a Sb content of about 5 wt % or more and about 10 wt % or less among the metallic constituents therein.

In this case, the solder paste for the first joint portion 31, used to mount the laminated ceramic capacitor 10, melts to spread with wettability over the surface of the first external electrode 15, and in that regard, banks with wettability so as to not only cover the first coating portion 15a, but also cover the second coating portion 15b, the fifth coating portion 15b, the sixth coating portion 15d, and the seventh coating portion 15e. Therefore, the solder joint material spread with wettability is thereafter solidified to form the first joint portion 31 adhering to the surface of the first external electrode 15 so as to cover the first coating portion 15a, the second coating portion 15b, the fifth coating portion 15b, the sixth coating portion 15d, and the seventh coating portion 15e as described above.

Furthermore, the solder paste for the second joint portion 32 also, used to mount the laminated ceramic capacitor 10, melts to spread with wettability over the surface of the second external electrode 16, and in that regard, banks with wettability so as to not only cover the third coating portion 16a, but also cover the fourth coating portion 16b, the eighth coating portion 16c, the ninth coating portion 16d, and the tenth coating portion 16e. Therefore, the solder joint material spread with wettability is thereafter solidified to define the second joint portion 32 adhering to the surface of the second external electrode 16 so as to cover the third coating portion 16a, the fourth coating portion 16b, the eighth coating portion 16c, the ninth coating portion 16d, and the tenth coating portion 16e as described above.

Figure 9:
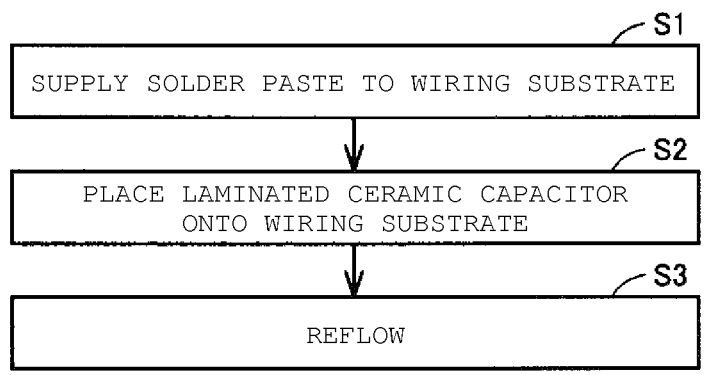
FIG. 9 is a diagram showing a manufacturing flow in manufacturing the mounted structure according to Preferred Embodiment 1 of the present invention.

FIG. 9 is a flow diagram representing a method for manufacturing the mounted structure according to the present preferred embodiment. Next, a non-limiting example of a method for manufacturing the mounted structure according to the present preferred embodiment will be specifically described with reference to FIG. 9.

For the manufacture of the mounted structure 1A according to a preferred embodiment of the present invention as described above, first, the above-configured laminated ceramic capacitor 10 and the above-configured wiring substrate 20A are prepared.

Next, as shown in FIG. 9, the solder paste is supplied to the wiring substrate 20A (step S1).

The step S1 is preferably carried out by a screen printing method with the use of stencil.

Specifically, a plate-shaped stencil (plate) is prepared in advance which is provided with a first hole and a second hole in position and size corresponding to the first land 25 and second land 26 of the wiring substrate 20A, the stencil is positioned and placed on the wiring substrate 20A so that the first hole and the second hole are respectively overlapped with the first land 25 and second land 26 of the wiring substrate 20A, and the solder paste is printed so that the first hole and the second hole are filled with the solder paste. In that regard, the excessive solder paste is scraped with the use of a squeegee or the like so as to keep the solder paste from remaining on the surface of the stencil. Thus, a predetermined amount of solder paste is supplied onto the first land 25 and second land 26 of the wiring substrate 20A.

It is to be noted that a case of using a screen printing method to supply the solder paste onto the first land 25 and the second land 26 has been illustrated as an example in the step S1 described above, other methods may be used to supply the solder paste onto the first land 25 and the second land 26, or the solder paste may be supplied onto the first coating portion 15a of the first external electrode 15 of and the third coating portion 16a of the second external electrode 16 of the laminated ceramic capacitor 10, or onto both the first land 25 and the first coating portion 15a as well as both the second land 26 and the third coating portion 16a.

Next, the laminated ceramic capacitor 10 is placed on the wiring substrate 20A (step S2). In the step S2, a chip mounter is preferably used, and the laminated ceramic capacitor 10 is positioned with a high degree of accuracy, and placed on the wiring substrate 20A so that the first coating portion 15a of the first external electrode 15 of the laminated ceramic capacitor 10 is opposed to the first land 25 of the wiring substrate 20A with the solder paste for the first joint portion 31 interposed therebetween, and the third coating portion 16a of the second external electrode 16 of the laminated ceramic capacitor 10 is opposed to the second land 26 of the wiring substrate 20A with the solder paste for the second joint portion 32 interposed therebetween.

Next, reflow is carried out (step S3). In the step S3, the laminated ceramic capacitor 10 placed on the wiring substrate 20A with the solder paste interposed therebetween is put along with the wiring substrate 20A and the solder paste as a whole into, for example, a reflow furnace.

Thus, the solder paste is melted by heating, and then solidified by cooling to form the first joint portion 31 and second joint portion 32 described above, thus mounting the laminated ceramic capacitor 10 onto the wiring substrate 20A.

As just described, the mounted structure 1A shown in FIG. 7 and FIGS. 8A and 8B is manufactured. It is to be noted that while a case of carrying out so-called reflow soldering with the use of a reflow furnace has been illustrated above as an example, so-called flow soldering may be carried out with the use of a jet-flow solder feeder.

Next, the reason that the mounted structure 1A according to the present preferred embodiment prevents a phenomenon of the laminated ceramic capacitor 10 mounted in a standing posture during mounting will be described in detail. It is to be noted that FIG. 10 is a conceptual diagram for explaining the mechanism of causing a phenomenon of an electronic component (laminated ceramic capacitor) brought into a standing posture during mounting in a mounted structure to which the present invention is not applied.

Figure 10:
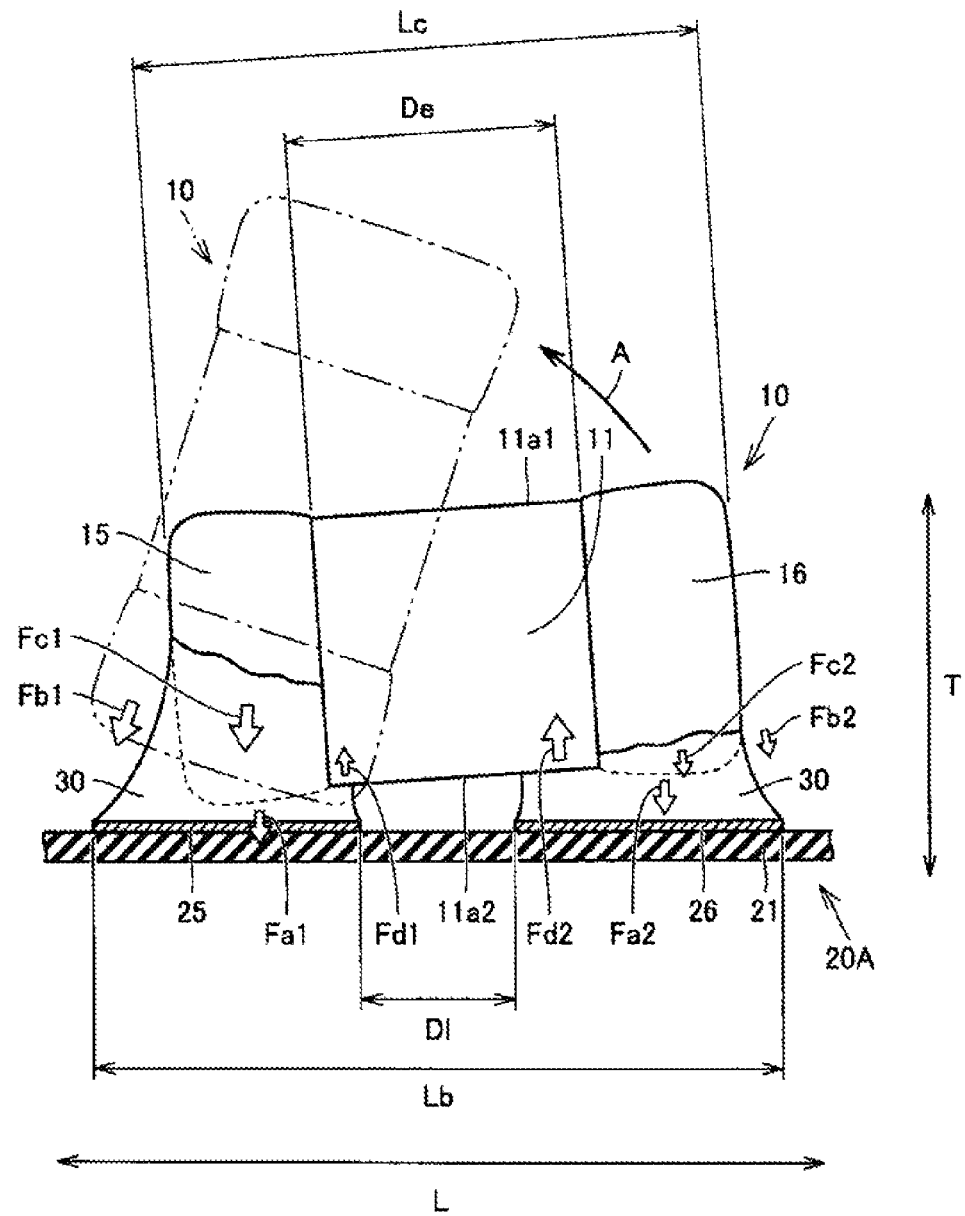
FIG. 10 is a conceptual diagram for explaining the mechanism of causing a phenomenon of an electronic component brought into a standing posture during mounting in a mounted structure to which the present invention is not applied.

As shown in FIG. 10, the external force applied by a melted solder joint material 30 on the laminated ceramic capacitor 10 as an electronic component during mounting is divided into forces Fa1 and Fa2 that pull the bottom surface of the first external electrode 15 and the bottom surface of the second external electrode 16 toward the wiring substrate 20A through the spread of the melted solder joint material 30 with wettability respectively over the bottom surfaces, forces Fb1 and Fb2 that pull the end surface of the first external electrode 15 and the end surface of the second external electrode 16 toward the wiring substrate 20A through the melted solder joint material 30 banked with wettability respectively over the end surfaces, and forces Fc1 and Fc2 that pull the pair of side surfaces of the first external electrode 15 and the pair of side surfaces the second external electrodes 16 toward the wiring substrate 20A through the spread of the melted solder joint material 30 with wettability respectively over the pairs of side surfaces.

In this case, the phenomenon of the laminated ceramic capacitor 10 mounted in a standing posture during mounting is caused by the fact as a contributory factor that, for example, as shown in FIG. 10, when the laminated ceramic capacitor 10 is misaligned with respect to the wiring substrate 20A so that the laminated ceramic capacitor 10 is positioned closer to the second land 26, more of the melted solder joint material 30 will bank with wettability over the end surface of the first external electrode 15 than the amount of the melted solder joint material that banks with wettability over the end surface of the second external electrode 16, and this increases in force Fa1 more than that in force Fa2 (that is, imbalance between the force Fa1 and the force Fa2) thus rotates the laminated ceramic capacitor 10 in the direction of an arrow A as shown in the figure, thus spacing the second external electrode 16 from the wiring substrate 20A.

Therefore, conventionally, in order to make this imbalance between the force Fa1 and the force Fa2 less likely to be caused in the first place, an approach has been adopted in which the dimension Lb in the length direction L from the end of the first land 25 on the side opposite to the position of the second land 26 to the end of the second land 26 on the site opposite to the position of the first land 25 is reduced to a relatively small dimension so as to be equal or approximately equal to the maximum outside dimension Lc of the laminated ceramic capacitor 10 in the length direction.

In that case, because of the inevitably reduced solder fillet formed on the end surface of the first external electrode and the end surface of the second external electrode 16, there is concern for a decrease in fixing strength, and conventionally, the outside dimension Le1 of the first land 25 in the length direction L and the outside dimension Le2 of the second land 26 in the length direction L are ensured to be large at the same time by reducing the distance Dl in the length direction L between the first land 25 and the second land 26.

However, in the case of such a configuration, the areas of portions of the first land 25 and second land 26 opposed to the body 11 will be increased, and the increased areas will result in contact between the melted solder joint material 30 spread with wettability on the first land 25 and the second land 26 and the body 11 of the laminated ceramic capacitor 10.

In this case, because the body 11 is considerably inferior in wettability to the solder joint material 30 in the first place, the body 11 and the melted solder joint material 30 will repel each other, and the forces Fd1 and Fd2 which try to push body 11 upward through the melted solder joint material 30 will be generated respectively on a portion of the body 11 closer to the first external electrode 15 and a portion thereof closer to the second external electrode 16.

In this case, as long as the laminated ceramic capacitor 10 is misaligned with respect to the wiring substrate 20A as described above, the imbalance is caused more than a little between the force Fb1 and force Fb2 generated on the end surfaces of the laminated ceramic capacitor 10, the forces Fd1 and Fd2 which try to push body 11 upward are thus coupled with the force Fb1 and the force Fb2 to result in induced rotation of the laminated ceramic capacitor 10 in the direction of the arrow A shown in the figure, and eventually, the second external electrode 16 spaced from the wiring substrate 20A causes the phenomenon of the laminated ceramic capacitor 10 mounted in a standing posture during mounting.

As just described, it has been conventionally believed that the factor of the phenomenon of the laminated ceramic capacitor 10 mounted in a standing posture during mounting consists in only the difference in tensile force, which is caused by the melted solder joint material 30 produced on the end surface of the first external electrode 15 and the end surface of the second external electrode 16, while the inventors have, as the result of research, discovered that sufficient consideration should be also given to the area of portions of the body 11 opposed to the first land 25 and the second land 26.

Accordingly, as described above, in the case of the mounted structure 1A according to the present preferred embodiment, the distance Dl in the length direction L between the first land 25 and the second land 26 and the distance De in the length direction L between the first coating portion 15a and third coating portion 16a of the laminated ceramic capacitor 10 are configured to fulfill a condition of $0.91 \leq \text{Dl/De} \leq 1.09$, for example.

This configuration sufficiently reduces the force which push the body 11 of the laminated ceramic capacitor 10 upward through the melted solder joint material, and makes it possible to the areas of portions of the first land 25 and second land 26 opposed to the body 11 described above, even if the laminated ceramic capacitor 10 is misaligned with respect to the wiring substrate 20A, and thus significantly reduces or prevents defective mounting of the laminated ceramic capacitor 10 mounted in a standing posture during mounting. It is to be noted that the condition mentioned above has been derived from a first verification test as will be described later.

Furthermore, from the viewpoint of preventing the defective mounting with more certainty, the distance Dl and distance De preferably further fulfill a condition of $\text{Dl/De} \leq 1.00$, for example. This configuration further significantly reduces the area of a portion of the body 11 opposed to the first land 25 or the second land 26, even when the laminated ceramic capacitor 10 is misaligned with respect to the wiring substrate 20A, and further reduces or prevents the generation of the defective mounting described above.

The joint strength herein with the first joint portion 31 and the second joint portion 32 are sufficiently ensured by the space located between the first coating portion 15a of the first external electrode 15 and the first land 25 and the space located between the third coating portion 16a of the second external electrode 16 and the second land 26, which are filled with the solder joint material, and in addition, the solder joint material adhering to each of the second coating portion 15b, fifth coating portion 15b, and sixth coating portion 15d of the first external electrode 15, and of the fourth coating portion 16b, eighth coating portion 16c, and ninth coating portion 16d of the second external electrode 16, as shown in FIGS. 7 and 8A and 8B.

In addition, as described above, in the case of the mounted structure 1A according to the present preferred embodiment, furthermore, the dimension Lb in the length direction L from the end of the first land 25 on the side opposite to the position of the second land 26 to the end of the second land 26 on the side opposite to the position of the first land 25 and the maximum outside dimension Lc of the laminated ceramic capacitor 10 in the length direction L are preferably configured to fulfill the condition of $1.00 \leq \text{Lb/Lc} \leq 1.32$, for example. This configuration increases the joint area with the first joint portion 31 and the second joint portion 32, and the generation of the defective mounting mentioned above is thus further reduced or prevented while further sufficiently ensuring the joint strength. It is to be noted that the condition mentioned above has been derived from a second verification test as will be described later.

Furthermore, as described above, in the case of the mounted structure 1A according to the present preferred embodiment, further, the outside dimension Wl1 of the first land 25 in the width direction W and the outside dimension Wl2 of the second land 26 in the width direction W, and the maximum value We1 of the first coating portion 15a of the laminated ceramic capacitor 10 in the width direction W and the maximum value We2 of the third coating portion 16a thereof in the width direction W are preferably configured respectively to fulfill conditions of: $1.00 \leq \text{Wl1/We1} \leq 1.30$ and $1.00 \leq \text{Wl2/We2} \leq 1.30$, for example. This configuration increases the joint area with the first joint portion 31 and the second joint portion 32, and the generation of the defective mounting mentioned above is thus further reduced or prevented while further sufficiently ensuring the joint strength.

It is to be noted that the mounted structure 1A according to the present preferred embodiment includes the first joint portion 31 and second joint portion 32, which are preferably formed by banking the solder joint material with wettability along the surfaces of the first external electrode and second external electrode 16 configured so as to cover the first end surface 11b1 and second end surface 11b2 of the body 11 of the laminated ceramic capacitor 10, as well as the first side surface 11c1 and second side surface 11c2 adjacent to the end surfaces. Thus, a great self-alignment effect is produced, and as a result, the laminated ceramic capacitor 10 is reliably mounted in the appropriate position.

In addition, in the case of the mounted structure 1A according to the present preferred embodiment, as described above, the surface layers of the first external electrode 15 and second external electrode 16 are preferably configured to contain Sn, and ternary materials containing Sn as their main constituent with an Ag content of more than 0 wt % and about 3.5 wt % or less and a Cu content of about 0.5 wt % or more and about 0.7 wt % or less among the metallic constituents may be used as the solder joint material.

In such compositions, because the melting temperature (e.g., about 217° C. to about 228° C.) of the ternary solder joint material is lower than the melting temperature (e.g., about 230° C.) of the Sn contained in the surface layers of the first external electrode 15 and second external electrode, the forces (i.e. the forces Fd1, Fd2 mentioned above) which push the body 11 upward will continue to be generated until the Sn is melted, but the configuration according to the present preferred embodiment can be used in a preferred manner, because the generation of the forces is reliably significantly reduced or prevented by fulfilling the conditions mentioned above.

Furthermore, in the case of the mounted structure 1A according to the present preferred embodiment, as described above, the surface layers of the first external electrode 15 and second external electrode 16 are preferably configured to contain Sn, and so-called high-temperature solders containing Sn as their main constituent with a Sb content of about 5 wt % or more and about 10 wt % or less among the metallic constituents may be used as the solder joint material.

In such compositions, because the melting temperatures (e.g., about 240° C. to about 260° C.) of the high-temperature solders are higher than the melting temperature (e.g., about 230° C.) of the Sn contained in the surface layers of the first external electrode 15 and second external electrode, the solder joint material baked with wettability will be generated onto the first external electrode 15 and the second external electrode 16 immediately after the high-temperature solders are melted, but the defective mounting described above is significantly reduced or prevented by fulfilling the conditions mentioned above, even when there is the solder joint material banked with wettability. It is to be noted that the high-temperature solders are intended to be applied in a preferred manner in mounted structures manufactured by mounting electronic components multiple times (e.g., mounted modules such as MPUs including IC components, and power sources and communication circuit components of portable electronic devices), etc.

As described above, the mounted structure 1A according to the present preferred embodiment achieves a mounted structure with a high degree of mounting position accuracy and sufficient joint strength ensured while significantly reduced or preventing generation of defective mounting of the laminated ceramic capacitor 10 brought into a standing posture during mounting.

First Verification Test

FIG. 11 is a table showing manufacturing conditions and test results for Verification Example 1 in a first verification test.

Figure 12:
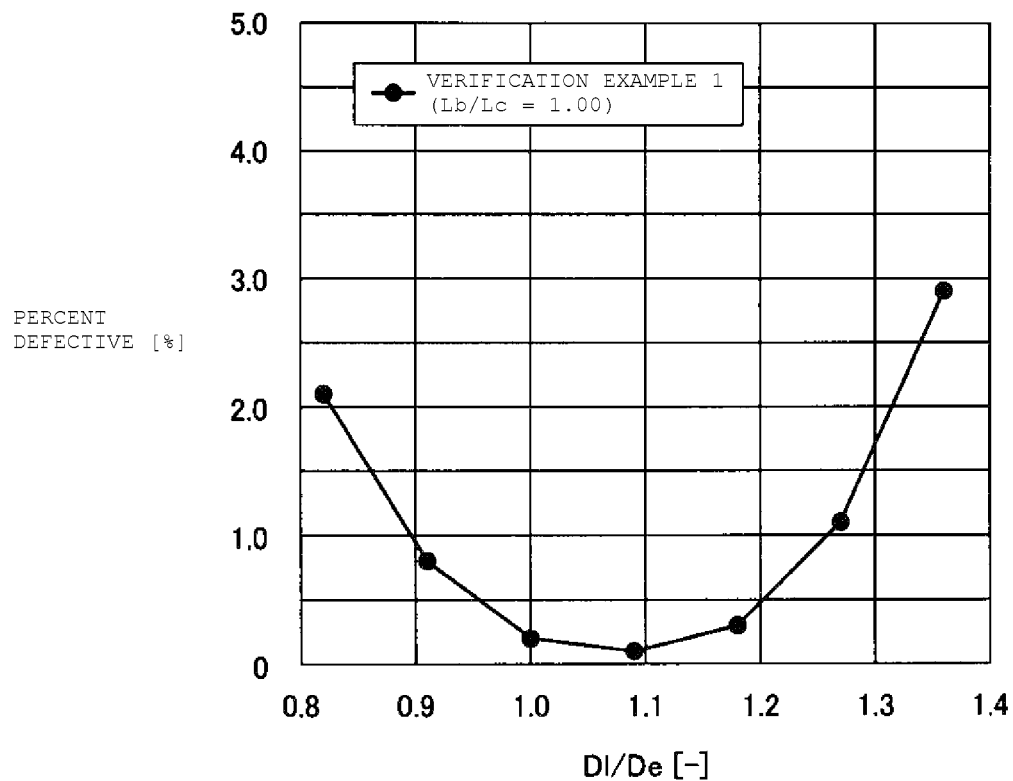
FIG. 12 is a graph showing the test results of Verification Example 1 in the first verification test.

In addition, FIG. 12 is a graph showing the test results for Verification Example 1 in the first verification test. Next, the first verification test carried out in association with Preferred Embodiment 1 of the present invention as described above will be described with reference to FIGS. 11 and 12.

This first verification test is a test for verifying how defective mounting of a laminated ceramic capacitor brought into a standing posture is affected by the relationship between the distance De in a length direction L between a first coating portion and a third coating portion in the laminated ceramic capacitor and the distance Dl in the length direction L between a first land and second land of a wiring substrate. In this first verification test, as Verification Example 1, laminated ceramic capacitors and wiring substrates with various dimensions as shown in FIG. 11 were prepared, and joined by reflow soldering with the use of a solder paste to mount the laminated ceramic capacitors onto the wiring substrates, and in that regard, the percent defectives were checked to confirm what percentage of samples generated defective mounting of the laminated ceramic capacitor brought into a standing posture.

In this case, the maximum outside dimensions Lc, Wc, and Tc of the laminated ceramic capacitors used in Verification Example 1 were approximately 0.25 mm×0.125 mm×0.125 mm, the outside dimensions Le1 and Le2 of the first external electrode and second external electrode in the length direction L were each adjusted to about 0.07 mm, and the distance De in the length direction L between the first coating portion and the second coating portion was adjusted to about 0.11 mm, for example.

In contrast, as the wiring substrates, in order to minimize the influence of an imbalance between the force Fb1 and force Fb2 which can be generated on end surfaces of the laminated ceramic capacitors during mounting, the dimension Lb in the length direction L from an end of a first land on the side opposite to the position of a second land to an end of the second land on the side opposite to the position of the first land was set to about 0.25 mm equal to the maximum outside dimension Lc of the laminated ceramic capacitor, and furthermore, the dimensions of the first land and second land in the width direction W were also set to about 0.125 mm equal to the maximum outside dimension Wc of the laminated ceramic capacitor, for example.

On the other hand, the outside dimensions Ll1 and Ll2 of the first land and second land provided for the wiring substrate in the length direction L were varied in stages between about 0.08 mm and about 0.05 mm, thus varying the distance Dl in the length direction L between the first land and the second land in stages between about 0.09 mm and about 0.15 mm, for example. Therefore, the ratios Dl/De for each sample are respectively about 0.82, about 0.91, about 1.00, about 1.09, about 1.18, about 1.27, and about 1.36, for example. It is to be noted that more than one set of capacitor and substrate was prepared for each sample, and the postures of the laminated ceramic capacitors mounted were visually observed to calculate the percent defective.

It is to be noted that as for the column "joint strength" in the test results, the samples in the condition in which the space located between the first coating portion and the first land and the space located between the third coating portion and the second land were sufficiently filled with the solder joint material were regarded as "Excellent", the samples in the condition in which the spaces were largely filled with the solder joint material was regarded as "Good", and the samples in which the condition which were largely deficient in solder joint material for filling the spaces were regarded as "Poor".

Further, as for the column "Evaluation" in the test results, the samples with the percent defective of about 0.5% or less at which defective joints were generated were regarded as "Excellent" among the samples with the "Excellent" or "Good" joint strength, the samples with the percent defective of more than about 0.5% and about 1.0% or less at which defective joints were generated were regarded as "Good" among the samples with the "Excellent" or "Good" joint strength, and the samples with the percent defective of more than about 1.0% and 2.0% or less at which defective joints were generated were regarded as "Good" among the samples with the "Excellent" or "Good" joint strength. It is to be noted that the samples with the percent defective in excess of about 2.0% at which defective joints were generated were regarded "Poor" regardless of the joint strength.

As shown in FIGS. 11 and 12, according to the results of the first verification test, it has been confirmed that the percent defective of the defective joint generation is reduced to about 2.0% or less while maintaining high joint strength by fulfilling the condition of 0.91≤Dl/De≤1.09 in the first verification example. In this case, the result of the high percentage of defective joints for the samples fulfilling the condition of Dl/De=0.81 is assumed to be due to the fact that when the laminated ceramic capacitor is misaligned with respect to the wiring substrate, the area of a portion of the body opposed to the first land or the second land is increased in a relatively large manner to cause the forces Fd1 and Fd2 mentioned above to induce the rotation of the laminated ceramic capacitor.

Based on the above results of the first verification test, it is understood that a mounted structure with a high degree of mounting position accuracy and sufficient joint strength ensured is achieved while significantly reducing or preventing the generation of defective mounting of the laminated ceramic capacitor brought into a standing posture during mounting by fulfilling the condition of 0.91≤Dl/De≤1.09, for example.

Second Verification Test

Figure 16:
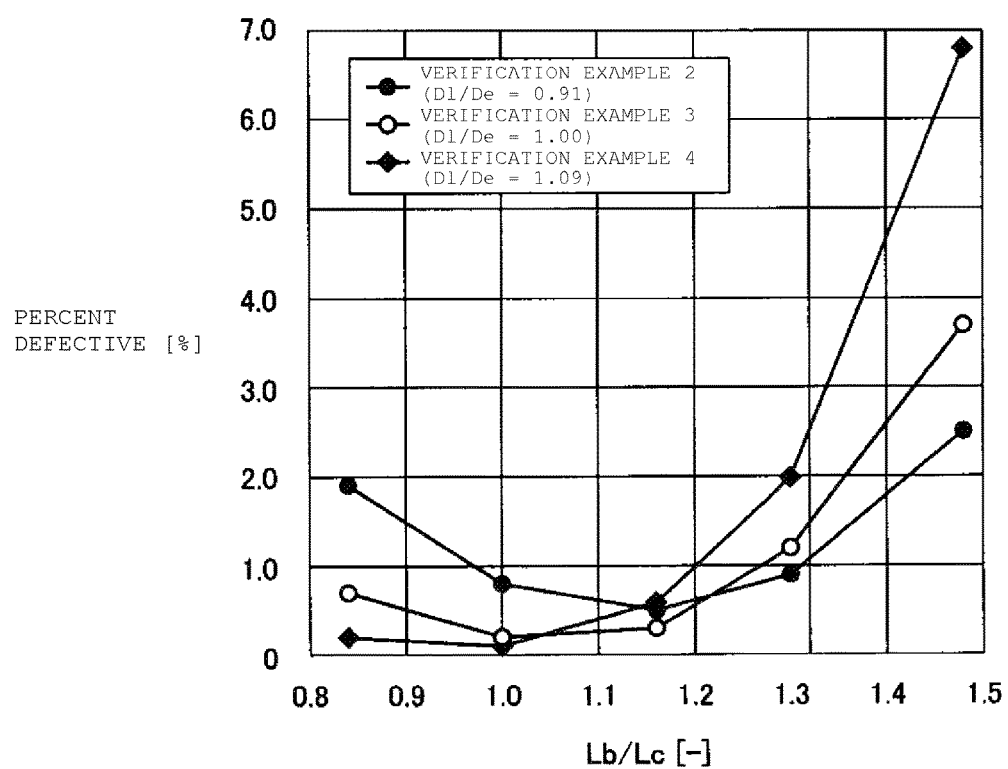
FIG. 16 is a graph showing the test results of Validation Example 2 through 4 in the second verification test.

FIGS. 13 through 15 are tables showing manufacturing conditions and test results of Validation Examples 2 through 4 in a second verification test. In addition, FIG. 16 is a graph showing the test results of Validation Examples 2 through 4 in the second verification test. Next, the second verification test carried out in association with Preferred Embodiment 1 of the present invention as described above will be described with reference to FIGS. 13 through 16.

This second verification test is, based on the result of the first verification test described above, a test for verifying how defective mounting of a laminated ceramic capacitor brought into a standing posture is affected by the relationship between the dimension Lb in the length direction L from an end of a first land on the side opposite to the position of a second land to an end of the second land on the side opposite to the position of the first land and the maximum outside dimension Lc of the laminated ceramic capacitor. In this second verification test, as Verification Examples 2 through 4, laminated ceramic capacitors and wiring substrates with various dimensions as shown in FIGS. 13 through 15 were prepared, and joined by reflow soldering with the use of a solder paste to mount the laminated ceramic capacitors onto the wiring substrates, and in that regard, the percent defectives were checked to confirm what percentage of samples generated defective mounting of the laminated ceramic capacitor brought into a standing posture.

In this case, the maximum outside dimensions Lc, Wc, and Tc of the laminated ceramic capacitors used in Verification Examples 2 through 4 were approximately 0.25 mm×0.125 mm×0.125 mm, the outside dimensions Le1 and Le2 of the first external electrode and second external electrode in the length direction L were each adjusted to about 0.07 mm, and the distance De in the length direction L between the first coating portion and the second coating portion was adjusted to about 0.11 mm, for example.

In contrast, as the wiring substrates, in Validation Examples 2 through 4, the distances Dl in the length direction L between the first land and second land were respectively set to about 0.1 mm, about 0.11 mm, and about 0.12 mm, and thus, the ratios Dl/De were respectively adjusted to about 0.91, about 1.00, and about 1.09, for example. It is to be noted that the dimensions of the first land and second land in the width direction W were set to about 0.125 mm equal to the maximum outside dimension We of the laminated ceramic capacitor.

On the other hand, in Validation Examples 2 through 4, the outside dimensions Ll1 and Ll2 of the first land and second land provided for the wiring substrate in the length direction L were varied in stages between about 0.055 mm and about 0.135 mm, thereby varying the dimension Lb in the length direction L from the end of the first land on the side opposite to the position of the second land to the end of the second land on the side opposite to the position of the first land in stages between about 0.21 mm and about 0.37 mm. Therefore, the ratios Lb/Lc for each sample in Validation Examples 2 through 4 are respectively about 0.84, about 1.00, about 1.16, about 1.32, and about 1.48. It is to be noted that more than one set of capacitor and substrate was prepared for each sample, and the postures of the laminated ceramic capacitors mounted were visually observed to calculate the percent defective.

It is to be noted that as for the column "joint strength" in the test results, the samples in the condition in which the space located between the first coating portion and the first land and the space located between the third coating portion and the second land were sufficiently filled with the solder joint material were regarded as "Excellent", the samples in the condition in which the spaces were largely filled with the solder joint material was regarded as "Good", and the samples in which the condition which were largely deficient in solder joint material for filling the spaces were regarded as "Poor".

Further, as for the column "Evaluation" in the test results, the samples with the percent defective of about 0.5% or less at which defective joints were generated were regarded as "Excellent" among the samples with the "Excellent" or "Good" joint strength, the samples with the percent defective of more than about 0.5% and about 1.0% or less at which defective joints were generated were regarded as "Good" among the samples with the "Excellent" or "Good" joint strength, and the samples with the percent defective of more than about 1.0% and about 2.0% or less at which defective joints were generated were regarded as "Good" among the samples with the "Excellent" or "Good" joint strength. It is to be noted that the samples with the percent defective in excess of about 2.0% at which defective joints were generated were regarded "Poor" regardless of the joint strength.

As shown in FIGS. 13 and 16, according to the results of the second verification test, it has been confirmed that the percent defective of the defective joint generation is reduced to about 2.0% or less while maintaining high joint strength by fulfilling the condition of 1.00≤Lb/Lc≤1.32 in the second verification example.

In addition, as shown in FIGS. 14 and 16, according to the results of the second verification test, it has been also confirmed that the percent defective of the defective joint generation is reduced to about 2.0% or less while maintaining high joint strength by fulfilling the condition of 1.00≤Lb/Lc≤1.32 in the third verification example.

Furthermore, as shown in FIGS. 15 and 16, according to the results of the second verification test, it has been also confirmed that the percent defective of the defective joint generation is reduced to about 2.0% or less while maintaining high joint strength by fulfilling the condition of 1.00≤Lb/Lc≤1.32 in the fourth verification example.

Based on the above results of the second verification test, it is understood that a mounted structure with a further high degree of mounting position accuracy and sufficient joint strength ensured is achieved while significantly reducing or preventing the generation of defective mounting of the laminated ceramic capacitor brought into a standing posture during mounting by fulfilling the condition of $0.91 \leq Dl/De \leq 1.09$, and also fulfilling the condition of $1.00 \leq Lb/Lc \leq 1.32$, for example.

Preferred Embodiment 2

Figure 17:
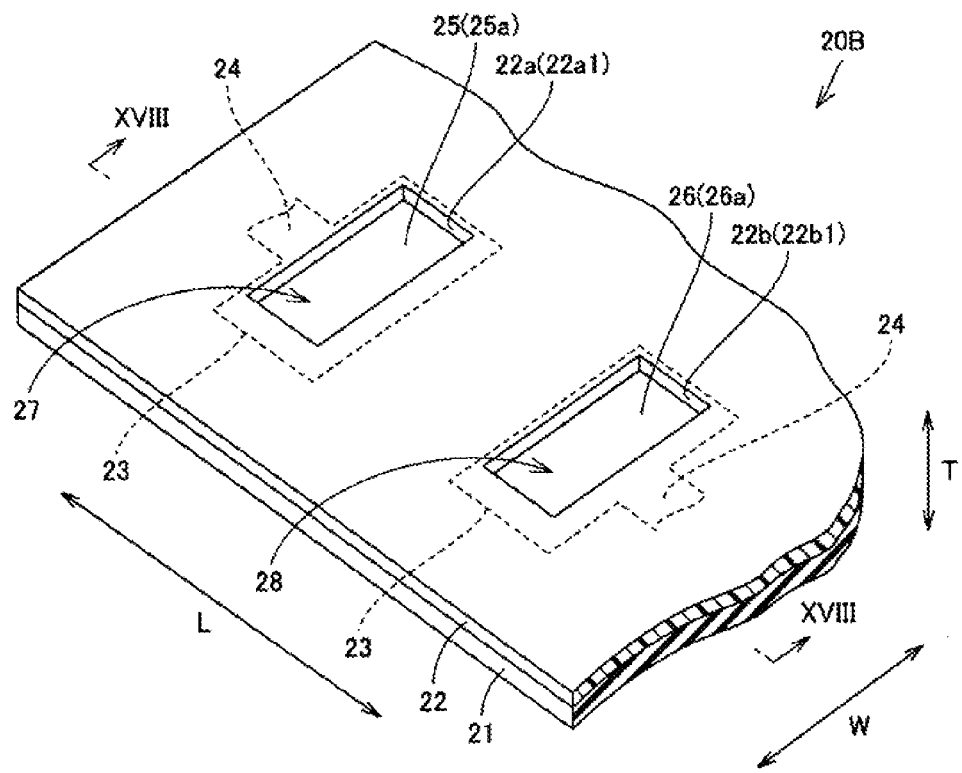
FIG. 17 is a schematic perspective view of a wiring substrate provided for the mounted structure according to Preferred Embodiment 2 of the present invention.
Figure 18:
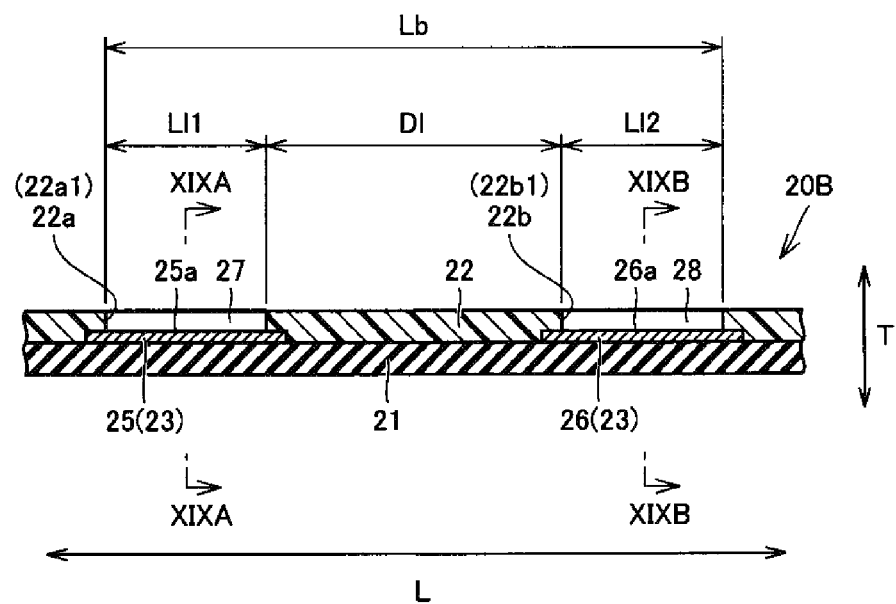
FIG. 18 is a schematic cross-sectional view along the line XVIII-XVIII shown in FIG. 17.
Figure 19A:
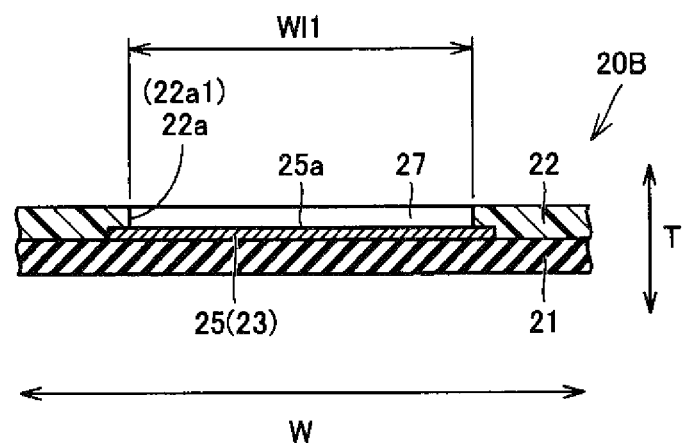
FIGS. 19A and 19B are schematic cross-sectional views along the line XIXA-XIXA and line XIXB-XIXB shown in FIG. 18.
Figure 19B:
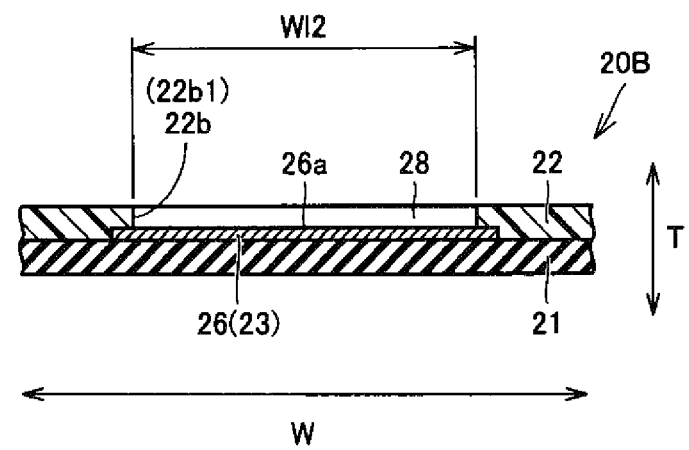

FIG. 17 is a schematic perspective view of a wiring substrate provided for a mounted structure according to the present preferred embodiment. In addition, FIG. 18 is a schematic cross-sectional view along the line XVIII-XVIII shown in FIG. 17, and FIGS. 19A and 19B are schematic cross-sectional views along the line XIXA-XIXA and line XIXB-XIXB shown in FIG. 18. Next, the wiring substrate 20B provided for the mounted structure according to the present preferred embodiment will be described with reference to FIG. 17 to FIGS. 19A and 19B.

As shown in FIGS. 17 to 18, the wiring substrate 20B, which has a generally plate-shaped configuration, is provided with a base 21, a solder resist 22, and conductive patterns 23.

The base 21 preferably is a plate-shaped and includes a pair of principal surfaces, and the solder resist 22 and conductive patterns 23 mentioned above are provided on at least one of the principal surfaces. As the material of the base 21, as in the case of the wiring substrate 20A according to Preferred Embodiment 1 as described above, materials can be used such as resin materials such as epoxy resins and ceramic materials such as alumina, or the materials with fillers, woven fabrics, etc. of inorganic materials or organic materials added thereto. In general, a glass epoxy substrate of an epoxy resin matrix with a glass woven fabric added thereto is preferably used in a preferred manner as the base 21.

The conductive patterns 23 are provided on the principal surface of the base 21, and patterned in predetermined shapes. The conductive patterns 23 include portion that define a first land 25 and a second land 26 as will be described later, and wiring portions 24 extracted from the first land 25 and the second land 26. While various types of conductive materials can be used as the materials of the conductive patterns 23, metallic materials such as copper foil are typically used in a preferred manner, as in the case of the wiring substrate 20A according to Preferred Embodiment 1 as described above.

The portions that define the first land 25 and the second land 26 of the conductive patterns 23 preferably have shapes corresponding to a first external electrode 15 of and a second external electrode 16 of a laminated ceramic capacitor 10, and with surfaces 25a and 26a of the portions exposed without being covered with the solder resist 22. In contrast, the conductive patterns 23 located around the portions that define the first land 25 and the second land 26, and the wiring portions 24 are all covered with the solder resist 22.

The solder resist 22 is provided on the principal surface of the base 21 and the principal surfaces of the conductive patterns 23, and patterned in a predetermined shape. The solder resist 22 is intended to prevent a solder joint material described later from adhering to unintended portions of the wiring substrate 20B in mounting the laminated ceramic capacitor 10 on the wiring substrate 20B, and mainly covers the portion except for the region on which the solder joint material is to be provided.

The solder resist 22 is provided with a pair of openings 22a and 22b in shapes corresponding to the first external electrode 15 and second external electrode 16 of the laminated ceramic capacitor 10, and the profiles of the first land 25 and second land 26 are defined by the pair of openings 22a and 22b.

Thus, the wiring substrate 20B includes a first void of the solder resist 22 defined by the surface 25a of the first land 25 of the conductive pattern 23 and a wall surface 22a1 of the opening 22a of the solder resist 22, and a second void 28 of the solder resist 22 defined by the surface 26a of the second land 26 of the conductive pattern 23 and a wall surface 22b1 of the opening 22b of the solder resist 22, and the first void 27 and the second void 28 are spaced in the length direction L of the wiring substrate 20B on which the laminated ceramic capacitor 10 is to be mounted.

It is to be noted that while the above-described configuration in which the conductive patterns located around the portions that define the lands are covered with the solder resist so that the outlines of the lands are defined by the openings provided in the solder resist is generally referred to as an over-resist structure, the wiring substrate may be configured so that the outer peripheral edges of the conductive patterns of the portions that define the lands conform with the peripheral edges of the openings without providing any conductive pattern around the portions that define the lands, or the outer peripheral edges of the conductive patterns of the portions that define the lands are located inside the peripheral edges of the openings. It is to be noted that from the perspective of preventing the conductive patterns 23 from peeling from the base 21, it is preferable to adopt the over-resist structure described above.

In this case, the distance Dl in the length direction L between the first land 25 and the second land 26 is configured to fulfill the same condition as that for the above-described wiring substrate 20A according to Preferred Embodiment 1, and the dimension Lb in the length direction L from an end of the first land 25 on the side opposite to the position of the second land 26 to an end of the second land 26 on the side opposite to the position of the first land 25, as well as the outside dimension Ll1 of the first land 25 in the length direction L and the outside dimension Ll2 of the second land 26 in the length direction L, and the outside dimension Wl1 of the first land 25 in the width direction W and the outside dimension Wl2 of the second land 26 in the width direction W are each preferably configured to fulfill the same conditions as those for the above-described wiring substrate 20A according to Preferred Embodiment 1.

Figure 20:
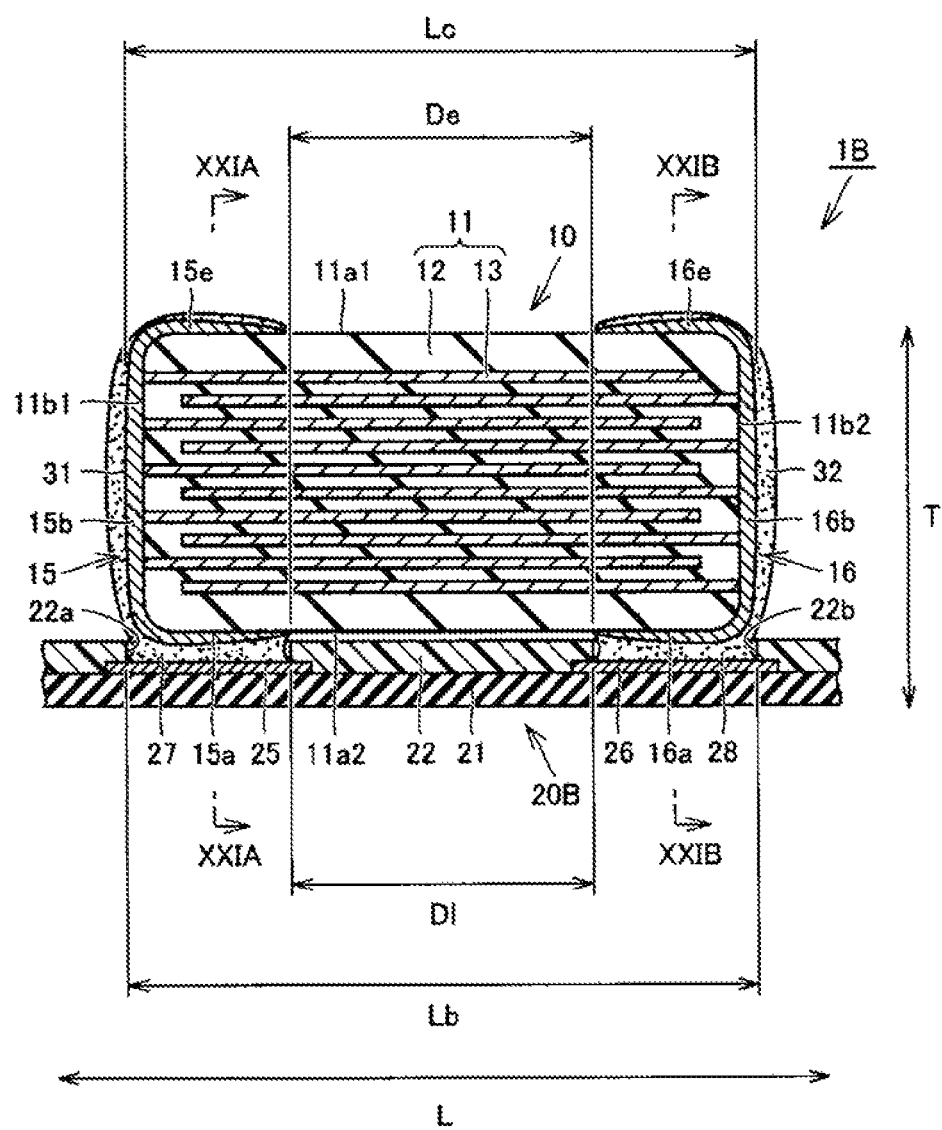
FIG. 20 is a schematic cross-sectional view of the mounted structure according to Preferred Embodiment 2 of the present invention.
Figure 21A:
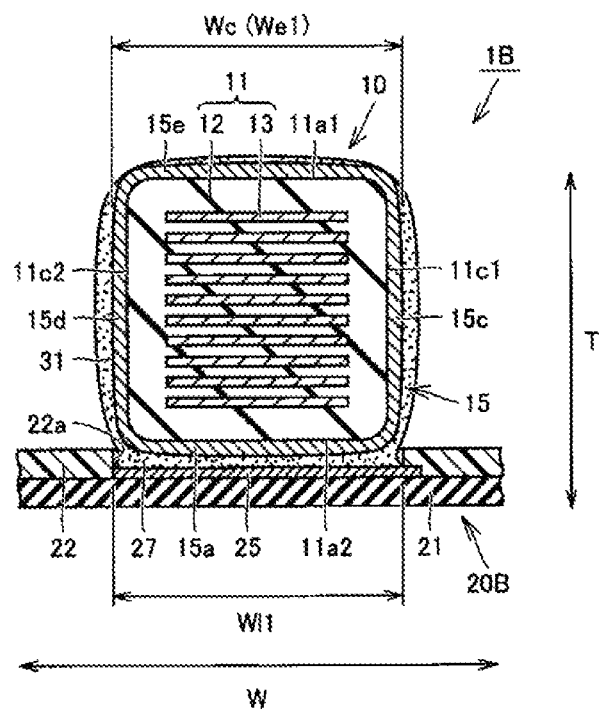
FIGS. 21A and 21B are schematic cross-sectional views along the line XXIA-XXIA and line XXIB-XXIB shown in FIG. 20.
Figure 21B:
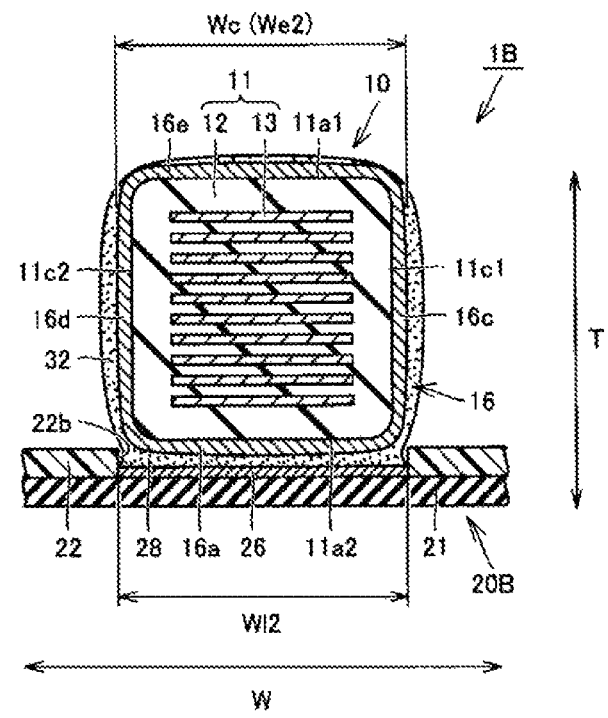

FIG. 20 is a schematic cross-sectional view of a mounted structure according to the present preferred embodiment, and FIGS. 21A and 21B are schematic cross-sectional views along the line XXIA-XXIA and line XXIB-XXIB shown in FIG. 20. Next, a mounted structure 1B according to the present preferred embodiment will be described with reference to FIG. 20 and FIGS. 21A and 21B.

As shown in FIG. 20 and FIGS. 21A and 21B, the mounted structure 1B has the above-described laminated ceramic capacitor mounted on the above-described wiring substrate 20B, and includes a first joint portion 31 and a second joint portion 32 which are composed of a solder joint material, in addition to the laminated ceramic capacitor 10 and the wiring substrate 20B.

The laminated ceramic capacitor 10 is placed with a second principal surface 11a2 of the body 11 opposed to the wiring substrate 20B, so that a first coating portion 15a of the first external electrode 15 is opposed to the first land 25 of the wiring substrate 20B, and a third coating portion 16a of the second external electrode 16 is opposed to the second land 26 of the wiring substrate 20B.

The first joint portion 31 joins the first external electrode 15 and first land 25 opposed to each other, adheres to the surface of the first land 25, and adheres to the surface of the first external electrode 15 so as to cover the first coating portion 15a, second coating portion 15b, fifth coating portion 15b, sixth coating portion 15d, and seventh coating portion 15e of the first external electrode 15.

On the other hand, the second joint portion 32 joins the second external electrode 16 and second land 26 opposed to each other, adheres to the surface of the second land 26, and adheres to the surface of the second external electrode 16 so as to cover the third coating portion 16a, fourth coating portion 16b, eighth coating portion 16c, ninth coating portion 16d, and tenth coating portion 16e of the second external electrode 16.

In the case of the mounted structure 1B herein according to the present preferred embodiment, the distance Dl in the length direction L between the first land 25 and the second land 26 and the distance De in the length direction L between the first coating portion 15a and third coating portion 16a of the laminated ceramic capacitor 10 preferably are configured to fulfill a condition of $0.91 \leq Dl/De \leq 1.09$, for example.

This configuration significantly reduces or prevents defective mounting of the laminated ceramic capacitor 10 mounted in a standing posture during mounting, as in the case of Preferred Embodiment 1 described above.

Furthermore, from the viewpoint of preventing the defective mounting with more certainty, the distance Dl and distance De preferably further fulfill a condition of $Dl/De \leq 1.00$, for example. This configuration further reduces or prevents the generation of the defective mounting mentioned above, as in the case of Preferred Embodiment 1 described above.

In addition, in the case of the mounted structure 1B according to the present preferred embodiment, furthermore, the dimension Lb in the length direction L from the end of the first land 25 on the side opposite to the position of the second land 26 to the end of the second land 26 on the side opposite to the position of the first land 25 and the maximum outside dimension Lc of the laminated ceramic capacitor 10 in the length direction L are preferably configured to fulfill the condition of $1.00 \leq Lb/Lc \leq 1.32$, for example. This configuration further significantly reduces or prevents the generation of the defective mounting mentioned above while further adequately ensuring the joint strength, as in the case of Preferred Embodiment 1 described above.

Furthermore, in the case of the mounted structure 1B according to a preferred embodiment of the present invention, further, the outside dimension Wl1 of the first land 25 in the width direction W and the outside dimension Wl2 of the second land 26 in the width direction W, and the maximum value We1 of the first coating portion 15a of the laminated ceramic capacitor in the width direction W and the maximum value We2 of the third coating portion 16a thereof in the width direction W are preferably configured respectively to fulfill conditions of: $1.00 \leq Wl1/We1 \leq 1.30$ and $1.00 \leq Wl2/We2 \leq 1.30$, for example. This configuration further significantly reduces or prevents the generation of the defective mounting mentioned above while further adequately ensuring the joint strength, as in the case of Preferred Embodiment 1 described above.

As described above, the mounted structure 1B according to the present preferred embodiment achieves a mounted structure with a high degree of mounting position accuracy and sufficient joint strength ensured while significantly reduces or prevents the generation of defective mounting of the laminated ceramic capacitor 10 brought into a standing posture during mounting.

It is to be noted that while cases of applying the preferred embodiments of present invention to a mounted structure with an electronic component mounted on a wiring substrate so that internal electrode layers are parallel to a main principal surface of the wiring substrate (that is, the stacking direction of the internal electrode layers is perpendicular to the main principal surface) have been explained as examples in Preferred Embodiments 1 and 2 of the present invention as described above, it is, of course, also possible to apply preferred embodiments of the present invention to a mounted structure with an electronic component mounted on a wiring substrate so that internal electrode layers are perpendicular to a main principal surface of the wiring substrate (that is, the stacking direction of the internal electrode layers is parallel to the principal surface).

Furthermore, while cases of applying preferred embodiments of the present invention to a mounted structure including an electronic component configured so that a pair of external electrodes each cover not only an end surface of a body located in the length direction and a bottom surface (second principal surface) closer to the end surface, but also a pair of side surfaces closer to the end surface and a ceiling surface (first principal surface) have been explained as examples in Preferred Embodiments 1 and 2 of the present invention as described above, preferred embodiments of the present invention can be applied in a preferred manner to a mounted structure including an electronic component configured so that a pair of external electrodes each cover at least an end surface of a body located in the length direction and a bottom surface (second principal surface) closer to the end surface.

The preferred embodiments disclosed herein by way of examples in all respects are not considered to be restrictive. The technical scope of the present invention is defined by what is claimed, and considered to encompass all changes within the spirit and scope equivalent to what is claimed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A structure comprising:
   a wiring substrate;
   an electronic component mounted on the wiring substrate via a solder joint material; wherein
   the electronic component includes:
   a body including a first principal surface and a second principal surface opposite to each other in a thickness direction, a first end surface and a second end surface opposite to each other in a length direction perpendicular or substantially perpendicular to the thickness direction, and a first side surface and a second side surface opposite to each other in a width direction perpendicular or substantially perpendicular to both the thickness direction and the length direction; and
   a first external electrode and a second external electrode spaced from each other in the length direction; wherein
   the first external electrode includes at least a first coating portion that covers a portion of the second principal surface located closer to the first end surface, a second coating portion that covers the first end surface, and a seventh coating portion that covers a portion of the first principal surface located closer to the first end surface;

the second external electrode includes at least a third coating portion that covers a portion of the second principal surface located closer to the second end surface, a fourth coating portion that covers the second end surface, and a tenth coating portion that covers a portion of the first principal surface located closer to the second end surface;

the wiring substrate includes:
a base including a principal surface; and
a first land and a second land on the principal surface and spaced from each other;

the electronic component includes the first coating portion opposed to the first land and the third coating portion opposed to the second land;

the solder joint material includes a first joint portion that joins the first external electrode and the first land, and a second joint portion that joins the second external electrode and the second land;

the first joint portion adheres to the first land, and adheres to the first external electrode so as to bridge between the first coating portion and the second coating portion;

the second joint portion adheres to the second land, and adheres to the second external electrode so as to bridge between the third coating portion and the fourth coating portion;

a maximum outside dimension of the electronic component is denoted by Lc in the length direction and Lc fulfills a condition of Lc≤0.5 mm;

Lc is the longest exterior dimension of the electronic component;

a distance between the first coating portion and the third coating portion in the length direction is denoted by De, a distance between the first land and the second land in the length direction is denoted by Dl, and De and Dl fulfill a condition of 0.91≤Dl/De≤1.09;

the first joint portion adheres to and covers the seventh coating portion of the first external electrode, and/or the second joint portion adheres to and covers the tenth coating portion of the second external electrode; and a dimension Lb in the length direction from an end of the first land on a side opposite to a position of the second land to an end of the second land on a side opposite to a position of the first land and the maximum outside dimension Lc of the electronic component in the length direction fulfills a condition of 1.00≤Lb/Lc≤1.32.

2. The structure according to claim 1, wherein De and Dl fulfill a condition of 0.91≤Dl/De≤1.00.

3. The structure according to claim 1, wherein
a surface layer of the first external electrode and a surface layer of the second external electrode contain Sn;
the solder joint material contains Sn, Ag, and Cu.

4. The structure according to claim 1, wherein
a surface layer of the first external electrode and a surface layer of the second external electrode contain Sn;
the solder joint material contains Sn and Sb.

5. The structure according to claim 1, wherein
the first external electrode further includes a fifth coating portion that covers a portion of the first side surface located closer to the first end surface, and a sixth coating portion that covers a portion of the second side surface located closer to the first end surface;

the second external electrode further includes an eighth coating portion that covers a portion of the first side surface located closer to the second end surface, and a ninth coating portion that covers a portion of the second side surface located closer to the second end surface;

the first joint portion adheres to the first land, and adheres to the first external electrode so as to cover the first coating portion, the second coating portion, the sixth coating portion, the seventh coating portion, and the fifth coating portion; and the second joint portion adheres to the second land, and adheres to the second external electrode so as to cover the third coating portion, the fourth coating portion, the eighth coating portion, the ninth coating portion, and the tenth coating portion.

6. The structure according to claim 1, wherein the electronic component is a laminated ceramic capacitor.

7. The structure according to claim 1, wherein the electronic component has a rectangular or substantially rectangular substantially parallelepiped shape.

8. The structure according to claim 1, wherein an outside dimension of the first land in the length direction and an outside dimension of the second land in the length direction are configured so as to be equal or substantially equal to each other, and the distance Dl in the length direction L between the first land and the second land is sufficient to ensure insulation performance therebetween.

9. The structure according to claim 1, wherein the solder joint material includes at least one ternary material with a melting temperature of about 217° C. to about 228° C., an Ag content of more than 0 wt % and about 3.5 wt % or less, and a Cu content of about 0.5 wt % or more and about 0.7 wt % or less among metallic constituents contained in the solder joint material.

10. The structure according to claim 1, wherein the solder joint material includes at least one material with a melting temperature of about 240° C. to about 260° C., and a Sb content of about 5 wt % or more and about 10 wt % or less among metallic constituents of the joint material.

11. The structure according to claim 1, wherein the wiring substrate is plate-shaped or substantially plate-shaped.

12. The structure according to claim 1, wherein the wiring substrate also includes a solder resist between the first land and the second land.

13. The structure according to claim 12, wherein the wiring substrate also includes wiring portions extracted from the first land and the second land.

14. The structure according to claim 13, wherein conductive patterns located around the first land and the second land, and the wiring portions are all covered with the solder resist.

15. The structure according to claim 13, wherein the solder resist includes openings having shapes corresponding to the first external electrode and second external electrode.

* * * * *